United States Patent
Lee et al.

(10) Patent No.: US 12,399,722 B2
(45) Date of Patent: Aug. 26, 2025

(54) MEMORY DEVICE AND METHOD INCLUDING PROCESSOR-IN-MEMORY WITH CIRCULAR INSTRUCTION MEMORY QUEUE

(71) Applicant: SAMSUNG ELECTRONICS CO., LTD., Suwon-si (KR)

(72) Inventors: Sukhan Lee, Seoul (KR); Shinhaeng Kang, Suwon-si (KR); Namsung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/814,236

(22) Filed: Mar. 10, 2020

(65) Prior Publication Data
US 2020/0293452 A1 Sep. 17, 2020

Related U.S. Application Data

(60) Provisional application No. 62/816,509, filed on Mar. 11, 2019.

(30) Foreign Application Priority Data

Feb. 4, 2020 (KR) .................. 10-2020-0013303

(51) Int. Cl.
*G06F 9/38* (2018.01)
*G06F 15/78* (2006.01)

(52) U.S. Cl.
CPC .......... *G06F 9/3877* (2013.01); *G06F 9/3814* (2013.01); *G06F 15/7821* (2013.01); *G06F 2212/452* (2013.01)

(58) Field of Classification Search
CPC .. G06F 9/3814; G06F 9/3877; G06F 15/7821; G06F 2212/452
See application file for complete search history.

(56) References Cited

U.S. PATENT DOCUMENTS

| | | | |
|---|---|---|---|
| 5,396,641 A | 3/1995 | Iobst et al. | |
| 6,237,079 B1 * | 5/2001 | Stoney .................. | G06F 9/3885 712/E9.067 |

(Continued)

FOREIGN PATENT DOCUMENTS

| | | |
|---|---|---|
| CN | 102460406 | 5/2012 |
| CN | 107408404 | 11/2017 |

(Continued)

OTHER PUBLICATIONS

Elliott et al., "Computational RAM: Implementing Processors in Memory", IEEE, 1999, pp. 32-41.*

(Continued)

*Primary Examiner* — David J. Huisman
(74) *Attorney, Agent, or Firm* — Morgan, Lewis & Bockius LLP

(57) ABSTRACT

A memory device includes a memory bank including one or more bank arrays, a PIM circuit configured to perform an operation logic processing operation, and an instruction memory including first to $m^{th}$ instruction queue segments configured in a circular instruction queue to store instructions provided by a host, where instructions stored in the first to $m^{th}$ instruction queue segments are executed in response to an operation request from the host and each new instruction provided by the host is written over a completely executed instruction in the circular instruction queue.

21 Claims, 15 Drawing Sheets

(56) References Cited

U.S. PATENT DOCUMENTS

| | | | |
|---|---|---|---|
| 6,564,271 B2* | 5/2003 | Micalizzi, Jr. | G06F 13/126 710/39 |
| 6,782,461 B2 | 8/2004 | Lam | |
| 8,234,460 B2 | 7/2012 | Walker | |
| 9,953,702 B2 | 4/2018 | Son | |
| 10,013,734 B1 | 7/2018 | Boles et al. | |
| 10,061,590 B2 | 8/2018 | Wheeler et al. | |
| 10,078,602 B2 | 9/2018 | Tokoyoda et al. | |
| 10,083,722 B2 | 9/2018 | Oh et al. | |
| 10,180,906 B2 | 1/2019 | Stocksdale et al. | |
| 10,318,168 B2 | 6/2019 | Lea et al. | |
| 10,474,581 B2 | 11/2019 | Willcock et al. | |
| 10,503,641 B2 | 12/2019 | Boyer et al. | |
| 10,592,467 B2 | 3/2020 | Ryu et al. | |
| 10,860,323 B2 | 12/2020 | Choi et al. | |
| 10,970,441 B1 | 4/2021 | Zhang et al. | |
| 2004/0193842 A1* | 9/2004 | Kirsch | G11C 7/1006 712/13 |
| 2006/0036779 A1 | 2/2006 | Kim et al. | |
| 2010/0241791 A1 | 9/2010 | Iwashiro et al. | |
| 2010/0262979 A1 | 10/2010 | Borchers et al. | |
| 2010/0312998 A1 | 12/2010 | Walker | |
| 2011/0093662 A1 | 4/2011 | Walker et al. | |
| 2011/0093665 A1 | 4/2011 | Walker et al. | |
| 2011/0231827 A1 | 9/2011 | Kilbane | |
| 2012/0215991 A1 | 8/2012 | Moyer | |
| 2013/0036314 A1 | 2/2013 | Glew et al. | |
| 2013/0169642 A1 | 7/2013 | Frascati et al. | |
| 2014/0115278 A1* | 4/2014 | Redford | G06F 13/1631 710/113 |
| 2014/0136811 A1 | 5/2014 | Fleischer et al. | |
| 2014/0215185 A1 | 7/2014 | Danielsen | |
| 2014/0281149 A1 | 9/2014 | Roberts et al. | |
| 2015/0046660 A1 | 2/2015 | Kim | |
| 2016/0041856 A1* | 2/2016 | Sankaralingam | G06F 15/7821 719/330 |
| 2016/0283232 A1* | 9/2016 | Sade | G06F 9/3842 |
| 2017/0060588 A1 | 3/2017 | Choi | |
| 2017/0168746 A1 | 6/2017 | Kwon et al. | |
| 2017/0177498 A1 | 6/2017 | Wilkes | |
| 2017/0263306 A1 | 9/2017 | Murphy | |
| 2017/0278584 A1 | 9/2017 | Rosti | |
| 2017/0344301 A1* | 11/2017 | Ryu | G06F 15/785 |
| 2017/0344480 A1 | 11/2017 | Beard et al. | |
| 2018/0024926 A1 | 1/2018 | Penney et al. | |
| 2018/0032458 A1 | 2/2018 | Bell | |
| 2018/0107406 A1 | 4/2018 | O et al. | |
| 2018/0239712 A1 | 8/2018 | Lea | |
| 2018/0276539 A1 | 9/2018 | Lea | |
| 2018/0322164 A1 | 11/2018 | Dasari et al. | |
| 2018/0329832 A1 | 11/2018 | Takau et al. | |
| 2018/0336035 A1 | 11/2018 | Choi et al. | |
| 2019/0034097 A1 | 1/2019 | Chang et al. | |
| 2019/0065111 A1 | 2/2019 | Lea et al. | |
| 2019/0074048 A1 | 3/2019 | Kwak et al. | |
| 2019/0138893 A1 | 5/2019 | Sharma et al. | |
| 2019/0198082 A1 | 6/2019 | O | |
| 2019/0258487 A1 | 8/2019 | Shin et al. | |
| 2020/0020393 A1 | 1/2020 | Al-Shamma | |
| 2020/0035291 A1* | 1/2020 | Kasibhatla | G06F 15/7821 |

FOREIGN PATENT DOCUMENTS

| | | |
|---|---|---|
| CN | 107450890 | 12/2017 |
| CN | 107767919 | 3/2018 |
| CN | 107958679 | 4/2018 |
| CN | 108885595 | 11/2018 |
| CN | 109147842 | 1/2019 |
| CN | 109196485 | 1/2019 |
| CN | 109378023 | 2/2019 |
| JP | 2003-122566 | 4/2003 |
| JP | 2007-213415 A | 8/2007 |
| JP | 2016-218635 A | 12/2016 |
| KR | 101457802 B1 | 11/2014 |
| KR | 10-2017-0045098 | 4/2017 |
| KR | 10-2017-0136055 | 12/2017 |
| KR | 10-2017-0138926 | 12/2017 |
| KR | 10-2018-0042111 | 4/2018 |
| KR | 10-1867219 | 6/2018 |
| KR | 10-2018-0100088 | 9/2018 |
| KR | 10-2019-0003564 A | 1/2019 |
| TW | 201802692 | 1/2018 |
| TW | 201804328 | 2/2018 |

OTHER PUBLICATIONS

Office Action dated Dec. 22, 2020 in Related U.S. Appl. No. 16/813,851; pp. 4-7.
Office Action dated Feb. 12, 2021 in Related U.S. Appl. No. 16/814,462; pp. 3-15.
Office Action dated Nov. 26, 2021 in Related U.S. Appl. No. 16/814,462; pp. 3-17.
Wikipedia entry entitled Program Counter. 5 pages, last edited on Oct. 28, 2020. Accessed Nov. 19, 2021. Retrieved from Internet <https://en.wikipedia.org/wiki/Program_counter>.
First Office Action dated Apr. 12, 2023 in corresponding IN Patent Application No. 202044010291.
Ping Chi, et al., "PRIME: A Novel Processing-in-memory Architecture for Neural Network Computation in ReRAM-based Main Memory", 2016 ACM/IEEE 43rd Annual Symposium on Computer Architecture (ISCA), Jun. 18, 2016, vol. 44, No. 3, pp. 27-39.
First Written Opinion dated Apr. 28, 2023 in corresponding Singapore Appln. No. 10202002213R.
First Written Opinion dated Jul. 3, 2023 in corresponding SG Application No. 10202002231W.
First Office Action dated Sep. 21, 2023 in corresponding CN Patent Application No. 202010149237.1.
Office Action dated Aug. 29, 2022 in related U.S. Appl. No. 16/814,462.
First Office Action dated Jun. 22, 2023 in corresponding SG Patent Application No. 10202002232U.
Office Action dated Dec. 22, 2023 in related U.S. Appl. No. 17/504,918.
First OA dated Dec. 13, 2023 in corresponding IN Patent Application No. 202044010294.
First OA dated November Nov. 2023 in corresponding CN Patent Application No. 202010165077.X.
1st Office Action dated Jun. 6, 2024 in corresponding CN Patent Application No. 202010165017.8.
Korean Office Action cited in KR Patent Application No. 10-2020-0013303, dated Dec. 23, 2024, 6 pages.
Office Action dated Mar. 22, 2024 in related TW Patent Application No. 109107592.
Office Action dated Nov. 26, 2021 in related U.S. Appl. No. 16/814,462.
Office Action dated Feb. 12, 2021 in related U.S. Appl. No. 16/814,462.
Office Action dated Dec. 22, 2020 in related U.S. Appl. No. 16/813,851.
Chinese Office Action issued in corresponding CN Patent Application No. 202010147089.X on Apr. 20, 2024.
Office Action dated Nov. 11, 2024 in corresponding KR Patent Application No. 10-2019-0151617.
Office Action dated Dec. 20, 2022 in related U.S. Appl. No. 17/504,918.
Second Chinese Office Action Dated Jan. 24, 2025 Cited in Corresponding CN Patent Application No. 202010165017.8.
Office Action dated Jul. 25, 2025 issued in corresponding Korean Patent Application No. 10-2019-0151617.

* cited by examiner

FIG. 11

|  | 0 (Index) | 1 (Index) | 2 (Index) |  |
|---|---|---|---|---|
| Row 1 | Inst 0 | Inst 1 | Inst 2 | Inst 3 |
| Row 2 | Inst 4 | Inst 5 | Inst 6 | Inst 7 |
| ⋮ | ⋮ | ⋮ | ⋮ | ⋮ |
| Row m | Inst (4m−4) | Inst (4m−3) | Inst (4m−2) | Inst (4m−1) |

Inst. Queue

MEMORY DEVICE AND METHOD INCLUDING PROCESSOR-IN-MEMORY WITH CIRCULAR INSTRUCTION MEMORY QUEUE

CROSS-REFERENCE TO RELATED APPLICATIONS

This application claims priority under 35 U.S.C. § 119 to US Provisional Application No. 62/816,509, filed on Mar. 11, 2019, in the United States Patent and Trademark Office, and to Korean Patent Application No. 10-2020-0013303, filed on Feb. 4, 2020, in the Korean Intellectual Property Office, the disclosures of which are incorporated by reference herein in their entireties.

TECHNICAL FIELD

Exemplary embodiments of the present inventive concept relate to memory devices, and more particularly, to a memory device and method including a circular instruction memory queue.

DISCUSSION OF RELATED ART

Capacities and speeds of semiconductor memory devices used for high performance electronic systems are increasing. A memory device may be used for storing various information items such as, for example, data used for various kinds of operation logic processing operations such as a neural network operation or operation processing results. In addition, in order to efficiently perform an increasing number of operations, a method of performing at least some operations by processor in memory (PIM) circuits within the memory device is contemplated.

For a neural network function, multiple operations may be performed, and instructions for performing the multiple operations may be stored, in the memory device. When an increasing number of instructions are stored in the memory device, area efficiency may be reduced and the cost of securing the memory device may increase.

SUMMARY

Exemplary embodiments of the inventive concept provide a memory device capable of improving efficiency for a storage space of instructions within the memory device to perform an increased number of operations, and a corresponding method of operating the same.

According to an exemplary embodiment of the inventive concept, a memory device includes a memory bank having one or more bank arrays of memory cells, a processor in memory (PIM) circuit configured to perform an operation logic processing operation by using at least one of data provided by a host or data read from the memory bank, and an instruction memory including a circular instruction memory queue having first to mth instruction queue segments used in a circle, where m is an integer of no less than 2, configured to store instructions provided by the host. Instructions stored in the first to mth instruction queue segments are executed in response to an operation request from the host and, as the instruction memory stores instructions based on a circular queue technique, a new instruction provided by the host is updated over a completely executed instruction at any segment in the circular queue.

According to an exemplary embodiment of the inventive concept, a memory device includes a memory bank including one or more bank arrays each including memory cells, a processor in memory (PIM) circuit configured to perform an operation logic processing operation by using at least one of data provided by a host or data read from the memory bank, an instruction memory including first to mth instruction queue segments, where m is an integer of no less than 2, configured to store instructions provided by the host, an index manager configured to generate indices corresponding to the instructions stored in the instruction memory, and an index order storage circuit configured to store index order information representing the execution order of the instructions from the host. As an operation request is provided by the host, instructions stored in the instruction memory are executed in the order in accordance with the index order information.

According to an exemplary embodiment of the inventive concept, a method of operating a memory device includes loading some of a plurality of instructions for a neural network function on a plurality of instruction queue segments of the instruction memory, the PIM circuit performing the operation logic processing operations by sequentially executing the loaded instructions, writing unexecuted others of a plurality of instructions for the neural network function in instruction queue segments over previously executed instructions, and the PIM circuit performing operation logic processing operations by sequentially executing the unexecuted instructions.

BRIEF DESCRIPTION OF THE DRAWINGS

Exemplary embodiments of the inventive concept will be more clearly understood from the following detailed description taken in conjunction with the accompanying drawings, in which:

FIG. 11 is a partial schematic conceptual diagram illustrating an instruction storage example and an index allocation example according to exemplary embodiments of the inventive concept;

DETAILED DESCRIPTION

Hereinafter, exemplary embodiments of the inventive concept will be described in detail with reference to the accompanying drawings.

Figure 1:
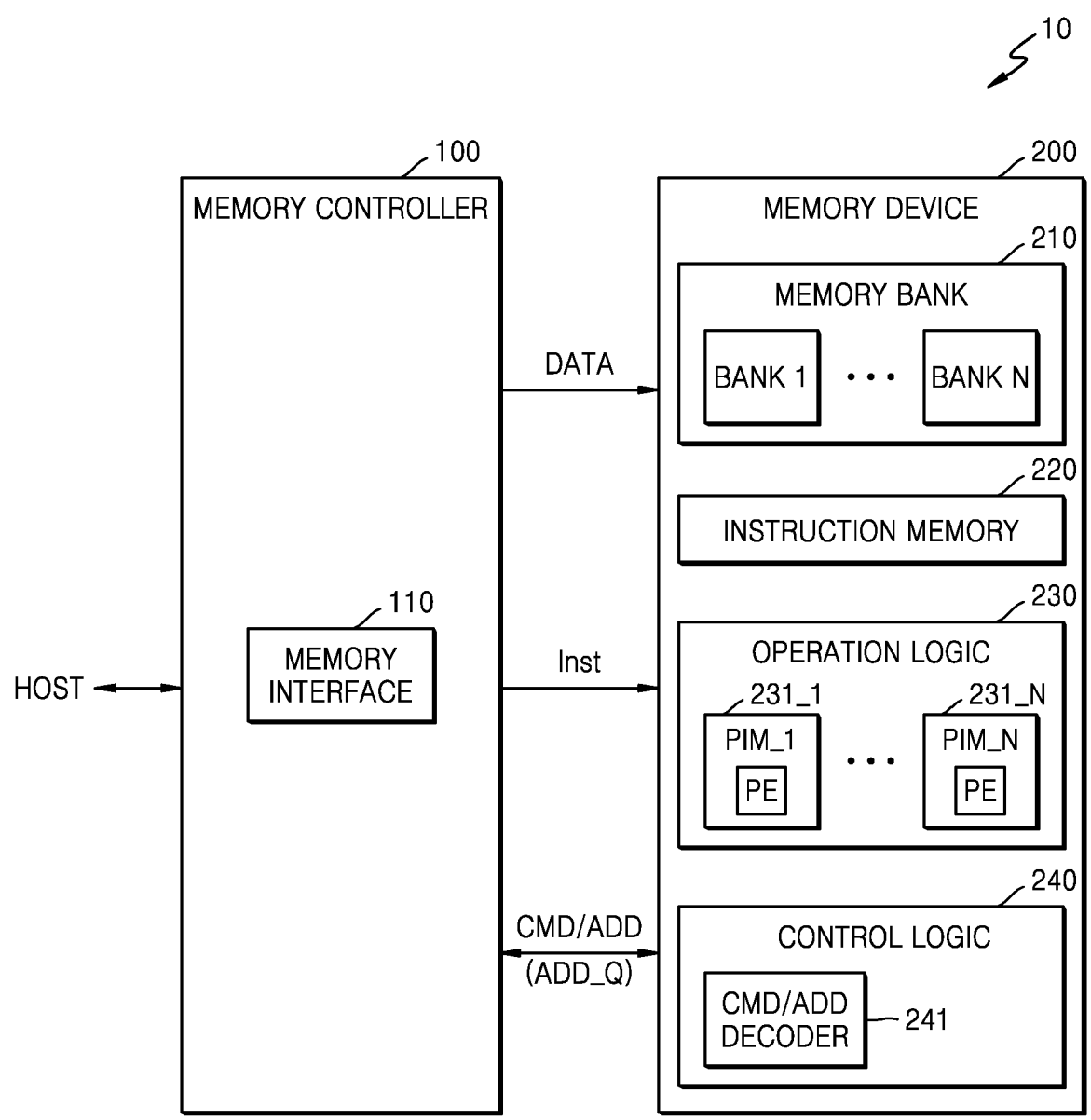
FIG. 1 is a schematic block diagram illustrating a data processing system including a memory device according to an exemplary embodiment of the inventive concept.

FIG. 1 illustrates a data processing system including a memory device according to an exemplary embodiment of the inventive concept.

Referring to FIG. 1, a memory system 10 may include a memory controller 100 and a memory device 200. The memory controller 100 may include a memory interface 110 and may control memory operations such as record and read by providing various signals to the memory device 200 through the memory interface 110. For example, the memory controller 100 may access data DATA of the memory device 200 by providing a command CMD and an address ADD to the memory device 200.

The memory controller 100 may access the memory device 200 in accordance with a request from a host HOST and the memory interface 110 may interface with the memory device 200. The memory controller 100 may communicate with the host HOST by using various protocols. According to exemplary embodiments, the memory controller 100 may correspond to the host HOST or a component provided in the host HOST. The host HOST, memory controller 100 and the memory device 200 may form the data processing system. Therefore, the memory system 10 may correspond to the data processing system or a component or components included in the data processing system.

The memory device 200 may include a memory bank 210, an instruction memory 220, an operation logic 230, and a control logic 240. The memory bank 210 may include a plurality of bank arrays, such as, for example, first to Nth bank arrays BANK1 to BANKN, and each of the first to Nth bank arrays BANK1 to BANKN may include a memory cell array including a plurality of memory cells. In addition, the operation logic 230 may include one or more processor in memory (PIM) circuits. In FIG. 1, an example is illustrated in which the operation logic 230 includes a plurality N of PIM circuits, such as, for example, first to Nth PIM circuits 231_1 through 231_N, to correspond to the N bank arrays of the memory bank 210. However, the operation logic 230 may include various numbers of PIM circuits. For example, when a plurality of PIM circuits are arranged to correspond to one bank, or fewer than N bank arrays, the number of PIM circuits may be greater than the number of bank arrays.

When one PIM circuit is shared by two or more bank arrays, the number of PIM circuits may be less than the number of bank arrays. Other embodiments are possible, such as one PIM circuit for the first two of every three bank arrays and two PIM circuits for the third bank array. In addition, each of the PIM circuits may perform an operation by using at least one of data from the host HOST or information read from the memory bank 210. In the case of at least two PIM circuits per bank, one of the two PIM circuits may perform an operation by using data from the host HOST while the other of the two PIM circuits may perform an operation by using information read from the memory bank 210.

A bank by which data access is to be performed may be selected by the address ADD from the memory controller 100, and memory cells within the bank may be selected. In addition, the control logic 240 may include a command and address decoder 241 and the command and address decoder 241 may perform a decoding operation on the command and/or the address CMD/ADD from the memory controller 100. The control logic 240 may perform an internal control operation on the memory device 200 so that a memory bank operation or another operation may be performed in accordance with the decoding result. For example, the control logic 240 may output an internal command for performing the internal control operation.

The memory device 200 may include dynamic random-access memory (DRAM) such as double data rate synchronous dynamic random access memory (DDR SDRAM), low power double data rate (LPDDR) SDRAM, graphics double data rate (GDDR) SDRAM, or Rambus dynamic random access memory (RDRAM). However, embodiments of the inventive concept are not limited thereto. For example, the memory device 200 may be implemented as non-volatile memory such as flash memory, magnetic RAM (MRAM), ferroelectric RAM (FeRAM), phase change RAM (PRAM), or resistive RAM (ReRAM).

In addition, the memory device 200 may correspond to a semiconductor chip or may be a component corresponding to a channel in a memory device including a plurality of channels having independent interfaces. Alternatively, the memory device 200 may be a component corresponding to a memory module. Alternatively, the memory module may include a plurality of memory chips and the memory device 200 of FIG. 1 may correspond to a memory chip mounted on a module board.

Hereinafter, according to exemplary embodiments of the inventive concept, an operation of storing instructions in the instruction memory 220, and an example in which the operation logic 230 performs an instruction processing operation, are described. Various kinds of instruction processing operations may be performed by the memory device 200. For example, in relation to artificial intelligence (AI), at least some of a plurality of operations for a neural network function may be performed by the memory device 200. For example, the host HOST may control the memory device 200 through the memory controller 100 so that at least some of the plurality of operations may be performed by the memory device 200. In addition, in an embodiment hereinafter, the memory controller 100 is illustrated as controlling the memory device 200. However, embodiments of the inventive concept are not limited thereto. For example, the memory controller 100 may correspond to a component provided in the host HOST where the host HOST controls the memory device 200.

The instruction memory 220 may store a plurality of instructions based on a circular queue technique, and may include a plurality of instruction queue segments. An instruction queue may include one or more storage circuits for storing information. According to an exemplary embodiment, one instruction queue segment may be defined as a unit for storing one instruction.

The memory controller 100 may transmit instructions Inst to the memory device 200 in order to perform an operation logic processing operation. For example, the memory controller 100 may transmit the plurality of instructions Inst to the memory device 200 so that a plurality of operation logic processing operations may be serially performed. For example, before the operation logic processing operations are performed, a mode such as, for example, an instruction loading mode, for loading the plurality of instructions Inst on the instruction memory 220 may be performed and, in the instruction loading mode, the plurality of instructions Inst may be loaded on the circular instruction queue of the instruction memory 220.

In FIG. 1, it is illustrated that the instructions Inst and the data DATA are transmitted through separate transmission buses. However, embodiments of the inventive concept may be implemented differently. For example, the instructions Inst may be transmitted through the same transmission bus as the data DATA.

All instructions corresponding to all operations performed by the memory device 200 for the neural network function may be loaded on the instruction memory 220 and executed. The instruction memory 220 may include a storage space of a size less than that for storing all of the instructions. For example, some of all the instructions may be stored in the instruction queue segments of the instruction memory 220, from where the stored instructions may be sequentially executed, and some instruction queue segments may store instructions that have been completely executed and are no longer needed. According to an exemplary embodiment of the inventive concept, the other instructions of all the instructions may be sequentially updated over the instruction queue segments containing the completely executed instructions.

Each of the first to Nth PIM circuits 231_1 through 231_N may include a processing element PE, and the processing element PE may perform an operation logic processing operation by using at least one of information read from a corresponding bank and/or the data DATA provided by the memory controller 100. In FIG. 1, one processing element PE is illustrated with respect to each of the PIM circuits. However, each of the PIM circuits may include a plurality of processing elements PE. The processing element PE may include various kinds of operators, for example, single instruction multi-data (SIMD) and an arithmetical and logical unit (ALU). In addition, each of the first to Nth PIM circuits 231_1 through 231_N may include various components related to operation processing. For example, each of the first to Nth PIM circuits 231_1 through 231_N may further include a storage circuit such as a register for temporarily storing data used for an operation logic processing operation or temporarily storing an operation processing result.

The memory device 200 may selectively perform a memory bank operation or an operation logic processing operation in response to the command and address CMD/ADD from the memory controller 100. For example, an additional command CMD for requesting an operation logic processing operation to be performed may be defined. In this case, when the command CMD defined for requesting the operation logic processing operation to be performed is received, an instruction is executed so that the operation logic processing operation may be performed. Alternatively, in an embodiment, the operation logic processing operation may be performed in response to a prescribed normal command CMD such as data record/read. As an operation example, a value of the address ADD from the memory controller 100 may belong to a range for directing a region of a substantial memory cell array or another range and the instruction may be executed based on a result of decoding the command and/or address CMD/ADD from the memory controller 100 so that the operation logic processing operation may be performed. In the following embodiments, it is assumed that operations of executing the instruction and updating a new instruction are performed in response to the normal command CMD.

According to an exemplary embodiment, the memory controller 100 may provide a command and an address CMD/ADD for storing or loading the instruction, and may provide a queue address ADD_Q for directing a position of the instruction memory 220, in relation to the instruction loading and updating operations to the memory device 200 as the address ADD. In addition, in updating the instruction to an instruction queue by the circular queue technique, the queue address ADD_Q from the memory controller 100 may direct an instruction queue in which a completely executed instruction is stored The above-described instruction updating operation may be performed by a runtime technique together with the operation logic processing operation so that, in response to reception of the command and/or address CMD/ADD for requesting the operation logic processing operation to be performed, the operation processing and instruction updating operations may be performed. Alternatively, according to various embodiments, the instruction updating operation and the operation logic processing operation may be performed at different timings by separate commands.

According to the above-described embodiment of the inventive concept, since a storage space for storing instructions for performing a vast amount of operation logic processing operations may be reduced, efficiency of an area may be improved and expenses for implementing memory used for storing the instructions may be reduced. In addition, since capacity of the instruction memory 220 may be reduced, high performance memory with a high access speed may be used. For example, a storage circuit such as a flip-flop or a latch having a higher access speed than static random access memory (SRAM) may be used for the instruction memory 220.

In FIG. 1, it is illustrated that the bank arrays, the instruction memory 220, and the operation logic 230 are separate components. However, an embodiment of the inventive concept is not limited thereto. For example, each of the bank arrays may be defined as including various components together with the memory cell array. For example, it may be defined that the instruction queue is included in each of the bank arrays and at least some of the components included in a PIM circuit may be defined as being included in the bank arrays.

The memory system 10 or the data processing system including the memory system 10 may be implemented by a personal computer (PC), a data server, a cloud system, an artificial intelligence server, a network-attached storage (NAS), an internet of things (IoT) device, or a portable electronic device. In addition, when the data processing system is the portable electronic device, the data processing system may be a laptop computer, a mobile telephone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

Figure 2:
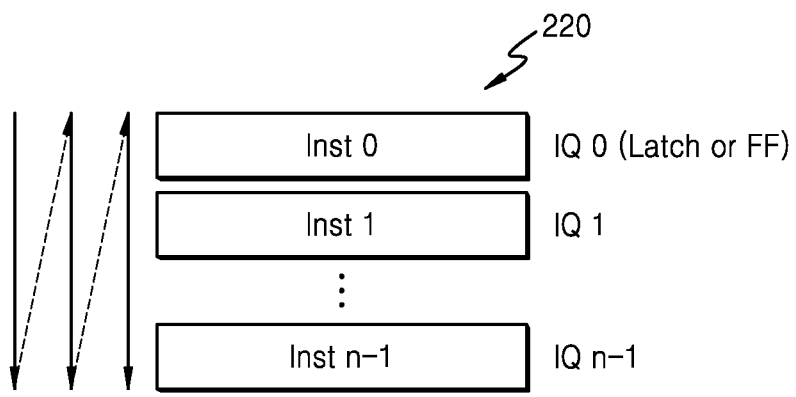
FIG. 2 is a schematic block diagram illustrating an implementation example of the instruction memory of FIG. 1.

FIG. 2 illustrates an implementation example of the instruction memory of FIG. 1.

Referring to FIGS. 1 and 2, the instruction memory 220 may include instruction queue segments such as, for example, first to nth instruction queue segments IQ 0 through IQ n−1, for storing a plurality of instructions by the circular queue technique. Each of the first to nth instruction queue segments IQ 0 through IQ n−1 may include a storage circuit. In FIG. 2, an example is illustrated in which a latch or a flip-flop is used. However, embodiments of the inventive concept are not limited thereto, and various kinds of other storage circuits may be applied. Moreover, if any latch or flip-flop is used, one such latch or flip-flop may be used on just the first segment, just any segment, a plurality of the segments, or all of the segments. If there are multiple circular queues, a latch or flip-flop may be used on just one, several (e.g., every odd numbered), or all of the circular queues. Where there are multiple circular queues, one may correspond with every PIM, or one may correspond with every plurality of PIMs, such as, for example, one circular queue for every pair of PIMs. Alternatively, there may be multiple circular queues per PIM. In yet another embodiment, some of multiple circular queues may be dynamically reassigned to other PIMs as desired to maximize speed or efficiency, or to ameliorate localized temperature variations within a die, for example.

As an operation example, some of the plurality of instructions for the neural network function may be stored in the first to nth instruction queue segments IQ 0 through IQ n−1. For example, in the instruction loading mode, first to nth instructions Inst 0 through Inst n−1 may be loaded on the instruction memory 220. Then, in response to the command and/or address CMD/ADD from the memory controller 100, the first to nth instructions Inst 0 through Inst n−1 stored in the instruction memory 220 may be sequentially executed. In addition, in the instruction queue in which the completely executed instruction is stored, the other instructions of the plurality of instructions may be updated and stored.

The instruction updating operation may be performed at various timings. When the operation logic processing operation is performed, an operation of updating a new instruction to the instruction queue may also be performed. For example, in a process of sequentially executing the first to nth instructions Inst 0 through Inst n−1, the instruction updating operation may start at specific timing and one instruction is executed and one new instruction may be updated to the instruction queue. For example, when, after the first instruction Inst 0 is executed, the next second instruction Inst 1 is executed, the instruction updating operation may start and the (n+1)th instruction may be updated to the completely executed first instruction queue segment IQ 0. In addition, as the third to nth instructions Inst 2 to Inst n−1 are sequentially executed, new instructions may be sequentially updated to the second to (n−1)th instruction queue segments IQ 1 through IQ n−2. By the above-described circular queue method, all the instructions included in the neural network function may be loaded on the instruction memory 220 and executed.

According to an exemplary embodiment, the instruction updating operation may start after the plurality of instructions are executed. As an operation example, when, after an instruction stored in a kth instruction queue is executed, where k is an integer less than n, and the next instruction is executing, the instruction updating operation may start from the first instruction queue segment IQ 0. Alternatively, the instruction updating operation may be performed when the instruction of the last instruction queue, such as, for example, the nth instruction queue segment IQ n−1, of the instruction memory 220 is executed. For example, when the instruction of the nth instruction queue segment IQ n−1 is executed, the instruction updating operation may start from the first instruction queue segment IQ 0.

According to some embodiments, the instruction updating operation may be performed at timing different from that at which the instruction is executed. As an operation example, after instructions of some of the first to nth instruction queue segments IQ 0 through IQ n−1 are executed, based on control from the memory controller 100, an operation of updating new instructions to at least some of the completely executed instruction queue segments may be performed. Then, instructions of other instruction queue segments of the first to nth instruction queue segments IQ 0 through IQ n−1 are executed. Then, an operation of updating at least some of the completely executed instruction queue segments may be performed again. Through the above-described process, an operation of executing instructions and an operation of updating new instructions may be alternately or simultaneously performed. Therefore, a plurality of instructions having a greater size than the instruction memory may be stored in the instruction memory and executed.

In the above-described embodiment, that the operation logic processing operation and the instruction updating operation are performed together need not mean that the above operations are simultaneously performed. As an operation example, the memory device 200 may sequentially perform the operation logic processing operation and the instruction updating operation or may perform the operation logic processing operation and the instruction updating operation in parallel in response to the command and/or address CMD/ADD from the memory controller 100. Alternatively, whenever the operation logic processing operation is performed, for the instruction updating operation, at least one of the command CMD and the address ADD may be further provided to the memory device 200, or the instruction updating operation may be performed in response to a separate command and/or address CMD/ADD.

Figure 3:
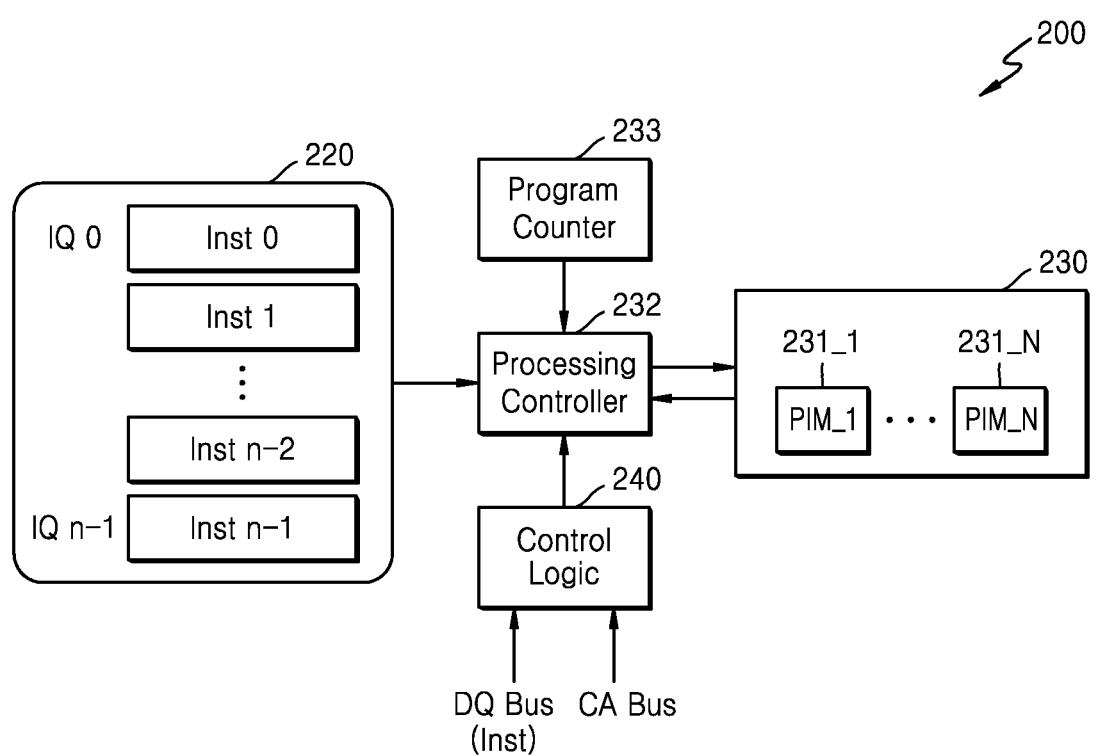
FIG. 3 is a schematic block diagram illustrating an implementation example of the memory device of FIG. 1.

FIG. 3 illustrates an implementation example of the memory device 200 of FIG. 1.

Referring to FIGS. 1 to 3, the memory device 200 may further include components related to the operation logic processing operation other than the components illustrated in FIG. 1. The memory device 200 may further include a processing controller 232 and a program counter 233 and the processing controller 232 may control an overall operation related to operation processing in the memory device 200. For example, the processing controller 232 may perform operations of reading and decoding instructions stored in the instruction memory 220 and may control the first to Nth PIM circuits 231_1 to 231_N so that an operation logic processing operation corresponding to a read instruction may be performed.

The program counter 233 may direct an instruction to be read from the instruction memory 220 by performing a program counting operation. For example, in response to reception of the command and/or address CMD/ADD that directs operation processing from the memory controller 100, an instruction in a position corresponding to a current counting value of the program counter 233 is read and a counting value may increase based on a counting operation. Alternatively, according to some embodiments, in response to the command and/or address CMD/ADD that directs operation processing, the current counting value of the program counter 233 increases and an instruction may be read from the position corresponding to the increased counting value. Moreover, particularly where the host and/or operation logic does not require one or more instructions to be executed in sequence, instructions from non-sequential segments within a circular queue may be efficiently executed out of sequence.

The processing controller 232 and the program counter 233 illustrated in FIG. 3 may be implemented in various forms. For example, the processing controller 232 and the program counter 233 may be provided in the operation logic 230. In addition, in FIG. 3, it is illustrated that the instruction memory 220, the processing controller 232, and the program counter 233 are commonly arranged in the first to Nth PIM circuits 231_1 to 231_N. However, the memory device 200 may be implemented so that the above components may be separately arranged in the PIM circuits, respectively.

An instruction loading operation and the instruction updating operation may be performed based on control of the control logic 240. For example, the control logic 240 may receive various information through a bus or buses from the memory controller 100. For example, the control logic 240 may receive instructions through a data bus DQ BUS and may receive a command and/or an address through a command address bus CA BUS. The control logic 240 may control an operation of storing the instructions received through the data bus DQ BUS in the instruction memory 220 in the instruction loading mode. In addition, according to exemplary embodiments of the inventive concept, the instruction updating operation may be performed by overwriting an instruction in the instruction memory 220 by the circular queue technique.

As an operation example, when the instruction updating operation is performed together with the operation logic processing operation, the operation logic processing operation may be performed by control of the processing controller 232 based on the instruction directed by the program counter 233. In addition, the control logic 240 may receive an address, such as, for example, a queue address ADD_Q, that represents a position of an instruction queue segment to be updated from the memory controller 100 together with the instruction, and may update instructions to the instruction memory 220 based on the received address by the circular queue technique.

Figure 4:
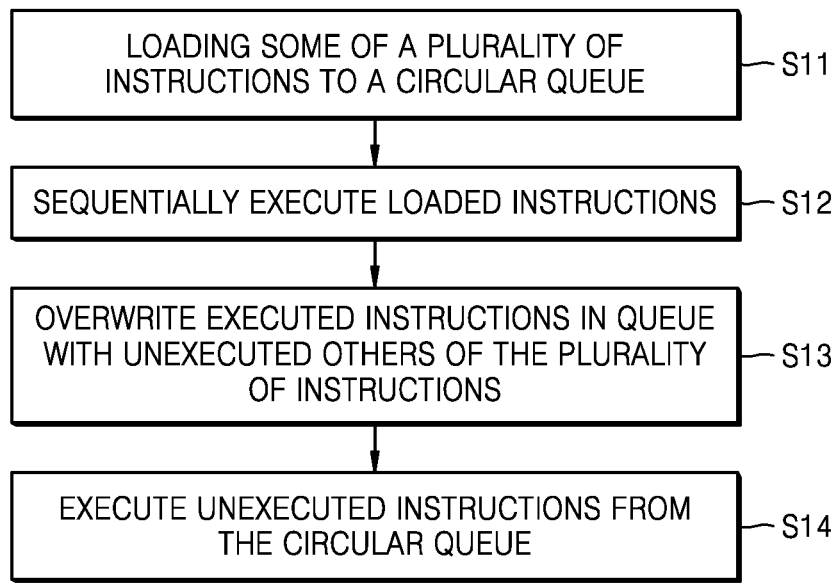
FIG. 4 is a flowchart diagram illustrating an operating method of a memory device according to an exemplary embodiment of the inventive concept.

FIG. 4 illustrates a method of operating a memory device according to an exemplary embodiment of the inventive concept.

Referring to FIG. 4, the memory device may include instruction memory for storing instructions for operation processing and the instruction memory may include a plurality of instruction queue segments in the circular queue technique. In addition, the plurality of instructions for the neural network function are executed by the memory device so that the operation logic processing operation may be performed and, when it is assumed that one instruction is stored in one instruction queue, since the number of instruction queue segments of the instruction memory is less than that of all the instructions for the neural network function, some of the plurality of instructions may be loaded onto the instruction queue in operation S11.

Then, the memory device may perform the operation logic processing operation based on control from the memory controller. For example, the memory device may sequentially execute instructions loaded on the instruction memory based on the program counting operation in operation S12. After an instruction loaded on the instruction memory is executed, the executed instruction need not be used further.

The memory device may perform the instruction updating operation together with the operation logic processing operation or at timing different from that at which the operation logic processing operation is performed. For example, the memory device may overwrite executed instructions with new instructions, such as, for example, other instructions of all the above-described instructions, over a previously executed instruction in the circular queue based on control from the memory controller in operation S13. Based on the number of all instructions related to the neural network function and the number of instruction queue segments provided in the instruction memory, an updating operation may be performed on one instruction queue one or more times.

As the instruction is updated as described above, after all of initially loaded instructions are executed, an unexecuted or updated instruction may be executed from the circular instruction queue in operation S14 and all the instructions related to the neural network function may be executed.

Figure 5:
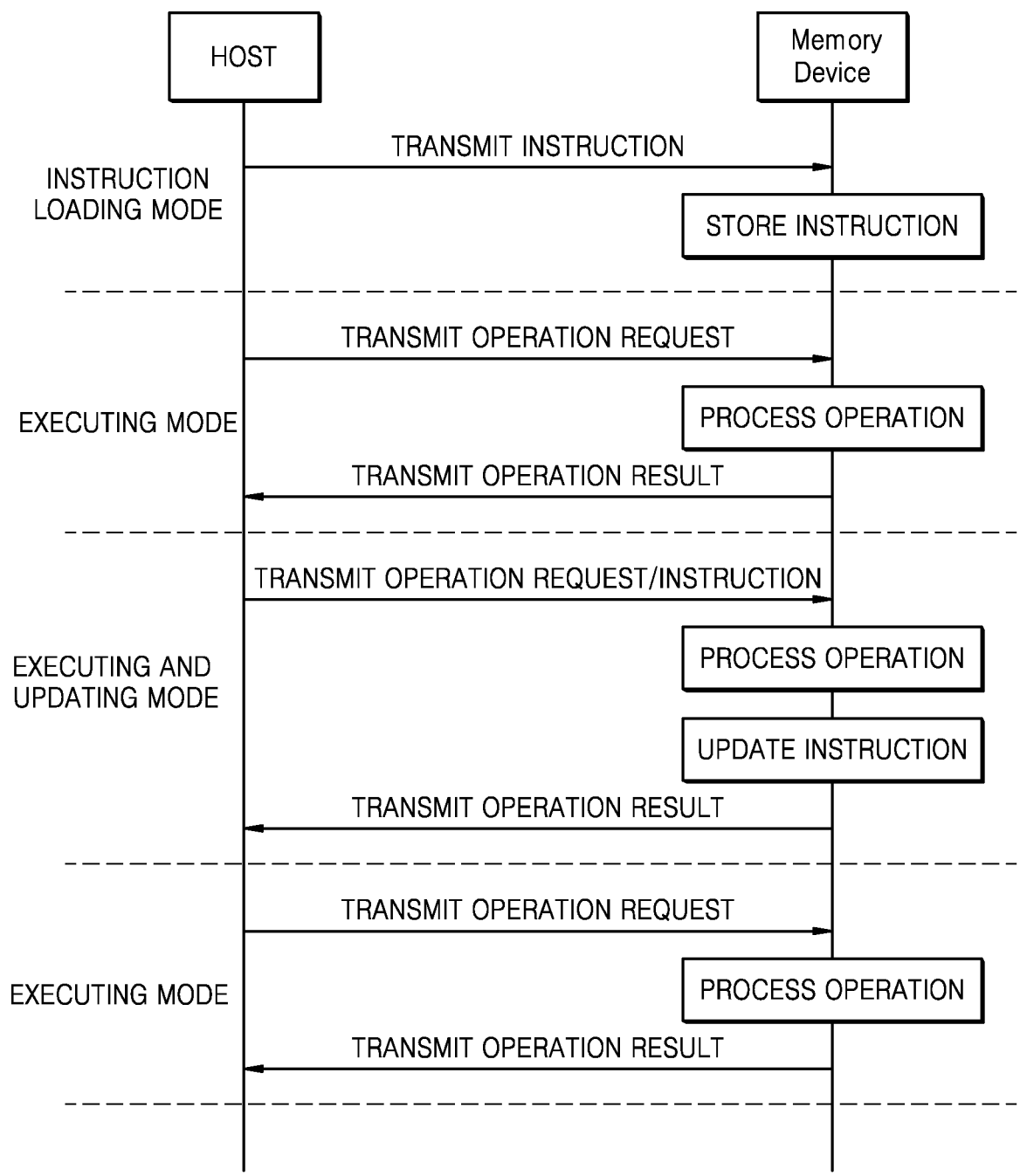
FIG. 5 is a partial schematic conceptual diagram illustrating an operation example of a memory system according to an exemplary embodiment of the inventive concept.

FIG. 5 illustrates an operation example of a memory system according to an exemplary embodiment of the inventive concept. In FIG. 5, an example in which the memory device communicates with the host HOST is illustrated. The host HOST may include a memory controller or a memory control module that communicates with the memory device.

The memory device may operate in a plurality of modes in relation to operation processing. Referring to FIG. 5, in the instruction loading mode, the host HOST may transmit a plurality of instructions required for operation processing to the memory device and the transmitted instructions may be stored in the instruction queue segments of the circular instruction queue in the memory device. For example, according to the above-described embodiments, only some of the plurality of instructions related to the neural network function might be initially stored in the instruction queue segments of the circular instruction queue.

The memory device may then operate in an instruction executing mode, where the host HOST may transmit an operation request, such as, for example, a command and/or an address that directs operation processing, to the memory device, and the memory device may sequentially execute instructions loaded in the instruction loading mode in response to the operation request based on the program counting operation. For example, various kinds of operation logic processing operations such as addition, subtraction, and multiplication may be performed by the memory device and, by decoding the instructions, operation logic processing operations corresponding to the instructions may be performed. In addition, according to an exemplary embodiment, operation results may be provided from the memory device to the host HOST. Moreover, processed data may be stored in the memory bank.

Then, the memory device may operate in an instruction executing and updating mode, where the host HOST may transmit a new instruction to be updated to the memory device together with the operation request, and the memory device may perform an operation logic processing operation by executing the instruction to correspond to the operation request. In addition, the memory device may update a new instruction from the host HOST to a previously executed instruction queue segment. For example, whenever one instruction is executed, one new instruction may be updated to the segment of the executed instruction.

By the above-described circular queue technique, all the instructions included in the neural network function may be stored in and updated to the instruction memory. Therefore, after all the instructions are stored in the instruction memory, so the memory device may operate in the instruction executing mode. In the instruction executing mode, the host HOST may transmit the operation request to the memory device and the memory device may sequentially execute instructions stored in instruction queue segments, and may transmit operation results to the host HOST and/or store them in the memory bank.

Although not specifically shown in FIG. 5, when an operation logic processing operation is performed, the host HOST may provide data to the memory device and the memory device may perform the operation logic processing operation by using at least one of the data from the host HOST and information stored in the memory bank.

Figure 6:
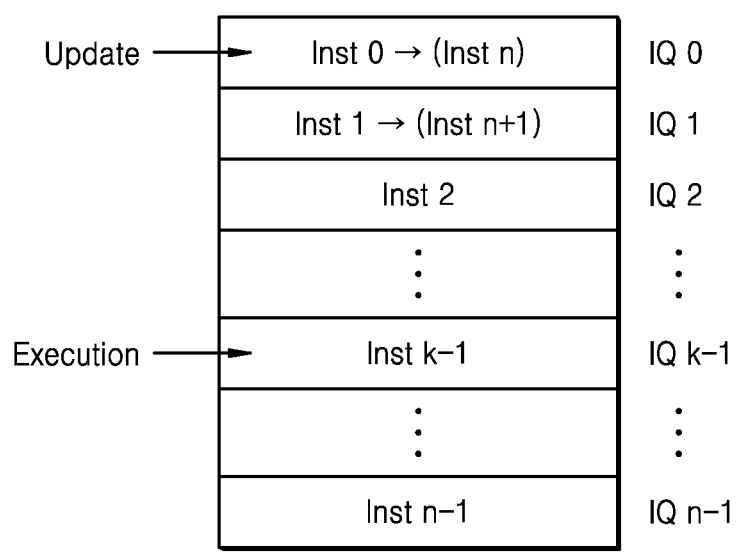
FIGS. 6 and 7 are partial schematic conceptual diagrams illustrating instruction updating operations according to an exemplary embodiment of the inventive concept.
Figure 7:
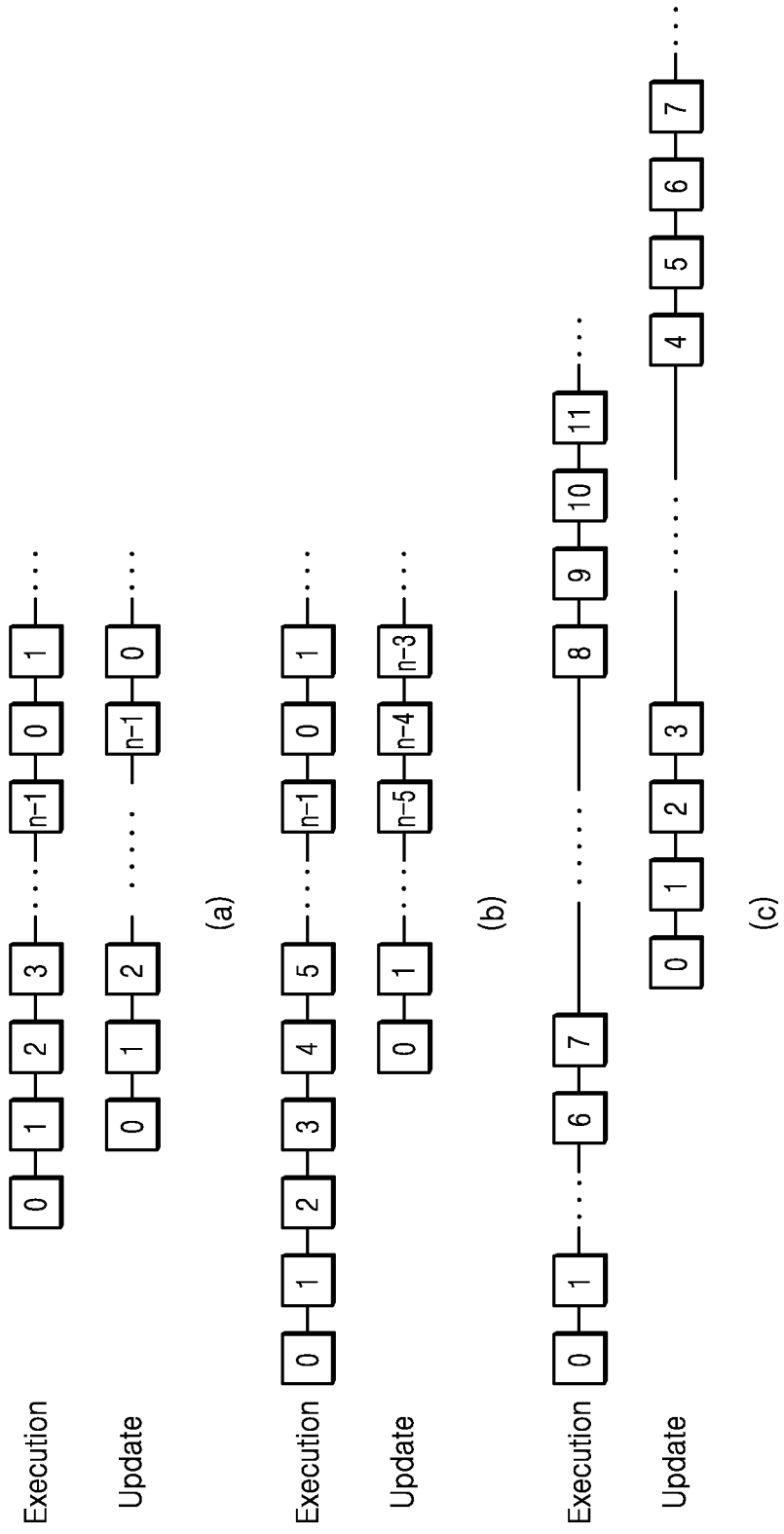

FIGS. 6 and 7 illustrate exemplary instruction updating operations according to an exemplary embodiment of the inventive concept.

Referring to FIG. 6, the instruction memory may include the first to nth instruction queue segments IQ 0 through IQ n−1 and, in the instruction loading mode, in the first to nth instruction queue segments IQ 0 through IQ n−1, the first to nth instructions Inst 0 through Inst n−1 may be stored. Then, as an operation logic processing operation is performed, the first to nth instructions Inst 0 through Inst n−1 may be sequentially executed.

According to exemplary embodiments, instructions may be sequentially executed in the instruction executing mode and an operation of updating new instructions may be performed at prescribed timing. In FIG. 6, an example in which, when the kth instruction Inst k−1 is executed, an instruction updating operation may start from the first instruction queue segment IQ 0 and the (n+1)th instruction Inst n is updated to the first instruction queue segment IQ 0 is illustrated. Then, as the (k+1)th instruction Inst k is executed, the (n+2)th instruction Inst n+1 may be updated to the second instruction queue segment IQ 1 and additional new instructions may be sequentially updated.

The instruction updating operation may be performed by the instruction memory illustrated in FIG. 6, as illustrated in FIG. 7, based on like methods.

Referring to FIG. 7A, an example is illustrated in which, after the first to nth instruction queue segments IQ 0 through IQ n−1 are loaded, an updating operation is performed whenever an instruction is executed. For example, after an instruction stored in the first instruction queue segment IQ 0 is executed, as an instruction stored in the second instruction queue segment IQ 1 is executing, an operation of updating the first instruction queue segment IQ 0 is performed and, as an instruction stored in the third instruction queue segment IQ 2 is executing, an operation of updating the second instruction queue segment IQ 1 may be performed. In addition, until all the instructions related to the neural network function are updated by the above-described method, an executed instruction may be overwritten with a new or unexecuted instruction.

Referring to FIG. 7B, after the first to nth instruction queue segments IQ 0 through IQ n−1 are completely loaded, an instruction updating operation may start after a certain number of instructions are executed. For example, after instructions stored in the first to fourth instructions queues IQ 0 through IQ 3 are executed, as an instruction stored in the fifth instruction queue segment IQ 4 is executed, an updating operation may start from the first instruction queue segment IQ 0. Then, whenever operation logic processing operations are sequentially performed, instruction updating operations may be sequentially performed and, until all the instructions are updated, a new instruction may be overwritten.

FIG. 7C illustrates an example in which the operation logic processing operation and the instruction updating operation are performed at different non-simultaneous timings.

As an operation example, after the first to nth instruction queue segments IQ 0 through IQ n−1 are completely loaded, the instruction updating operation may start after a certain number of instructions are executed. In FIG. 7C, an example is illustrated in which, after instructions stored in the first to eighth instruction queue segments IQ 0 through IQ 7 are executed, an instruction updating operation starts and a certain number (for example, four) of instructions are updated at timing different from that at which the operation logic processing operation is performed. Then, operations of executing and updating a prescribed number (for example, four) of instructions may be repeated until all the instructions are loaded. However, an embodiment of the inventive concept is not limited thereto. The instruction updating operation may start at various timings and operations of executing and updating instructions may be performed in units of various numbers of instructions. Alternatively, the instruction updating operation may start at dynamically variable timings and operations of executing and updating instructions may be performed in dynamically variable units of numbers of instructions.

Figure 8:
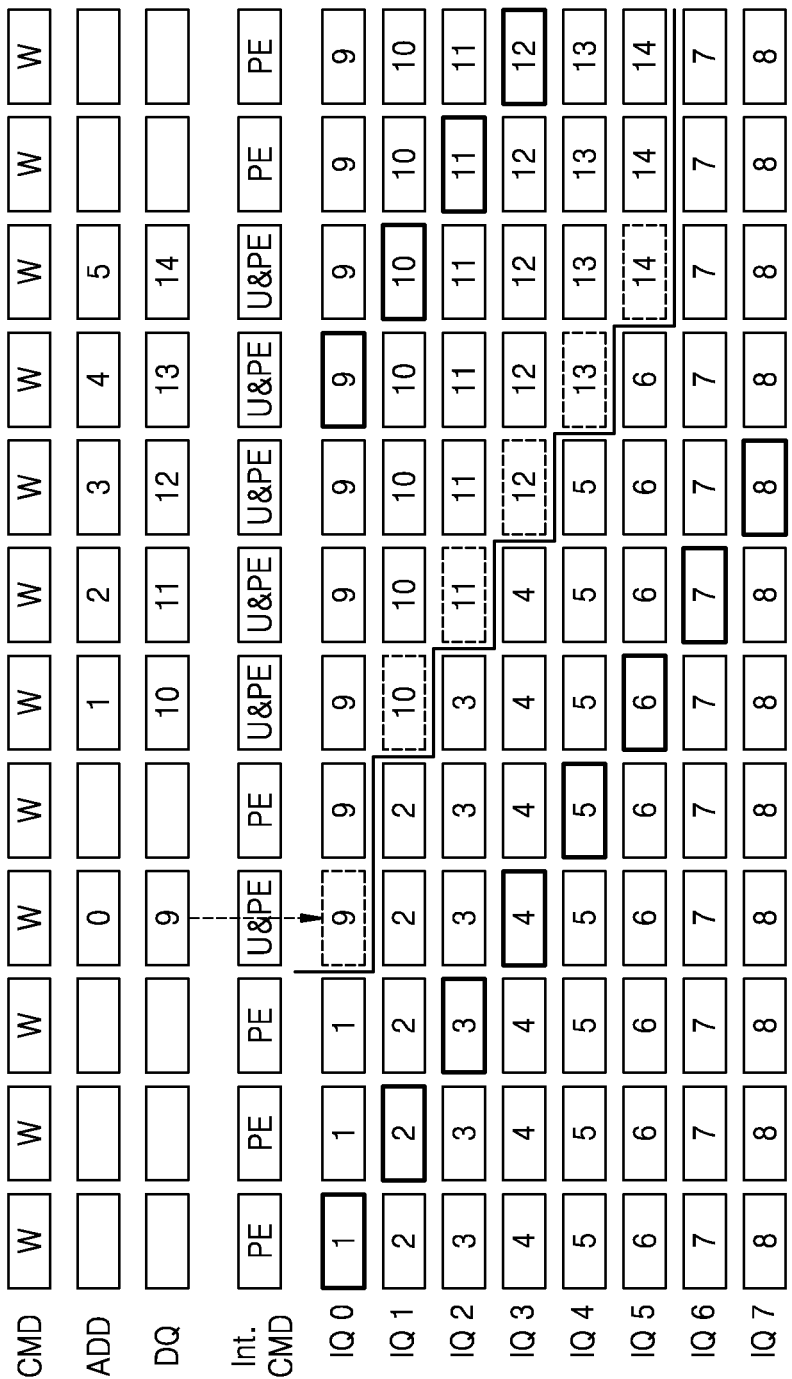
FIG. 8 is a partial schematic conceptual diagram illustrating an example of signals related to an instruction updating operation according to exemplary embodiments of the inventive concept.

FIG. 8 illustrates an example of signals related to an instruction updating operation according to exemplary embodiments of the inventive concept. The address ADD illustrated in FIG. 8 may correspond to the queue segment address mentioned in the above-described embodiment. For ease of description, instructions stored in the instruction memory are represented by numbers 1-14. The number 1 stored in the instruction memory may correspond to the first instruction Inst 0 and the number 8 may correspond to the eighth instruction Inst 7. In addition, in FIG. 8, instructions marked with bold solid lines in the instruction memory represent executing instructions and instructions marked with dashed lines represent newly updated instructions.

Referring to FIG. 8, the memory device may generate an internal command Int. CMD by receiving the command and/or address CMD/ADD from the host HOST and decoding the received command and/or address CMD/ADD. In accordance with the generated internal command Int. CMD, internal operations of the memory device may be controlled. For example, an operation logic processing operation PE and an updating operation U may be performed. In addition, in FIG. 8, it is assumed that a command for a normal recording operation W is used as a command CMD related to operation processing and operations of eight instruction queue segments IQ 0 through IQ 7 are initially illustrated.

Only the operation logic processing operation may be performed in accordance with a result of decoding the command and/or address CMD/ADD. Although not specifically shown in FIG. 8, when the operation request is defined based on a combination of the command CMD and the address ADD, the address ADD that directs operation processing may be received by the memory device. For example, the address ADD of a prescribed range for directing operation processing is defined and the address ADD of the defined range may be received in order to direct operation processing.

As an instruction 4 stored in the fourth instruction queue segment IQ 3 is executed, the instruction updating operation U&PE for instruction 9 from the data bus DQ may be performed and the memory device may perform the instruction updating operation while performing the operation logic processing operation in accordance with the internal command Int. CMD based on the instruction stored in the fourth instruction queue segment IQ 3. For example, an address that directs the first instruction queue segment IQ 0 to which an instruction is to be updated may be received from the host HOST. Therefore, a ninth instruction may be updated to the first instruction queue.

According to exemplary embodiments, in a partial operation processing process, the instruction updating operation might not be immediately performed. In FIG. 8, an example is illustrated in which the instruction updating operation is not performed on IQ 1 when an instruction stored in the fifth instruction queue segment IQ 4 is executed. Then, as the command and/or address CMD/ADD that performs the operation logic processing operation and the instruction updating operation is received, instruction updating operations may be sequentially performed on the second to sixth instruction queue segments IQ 1 through IQ 5.

Figure 9:
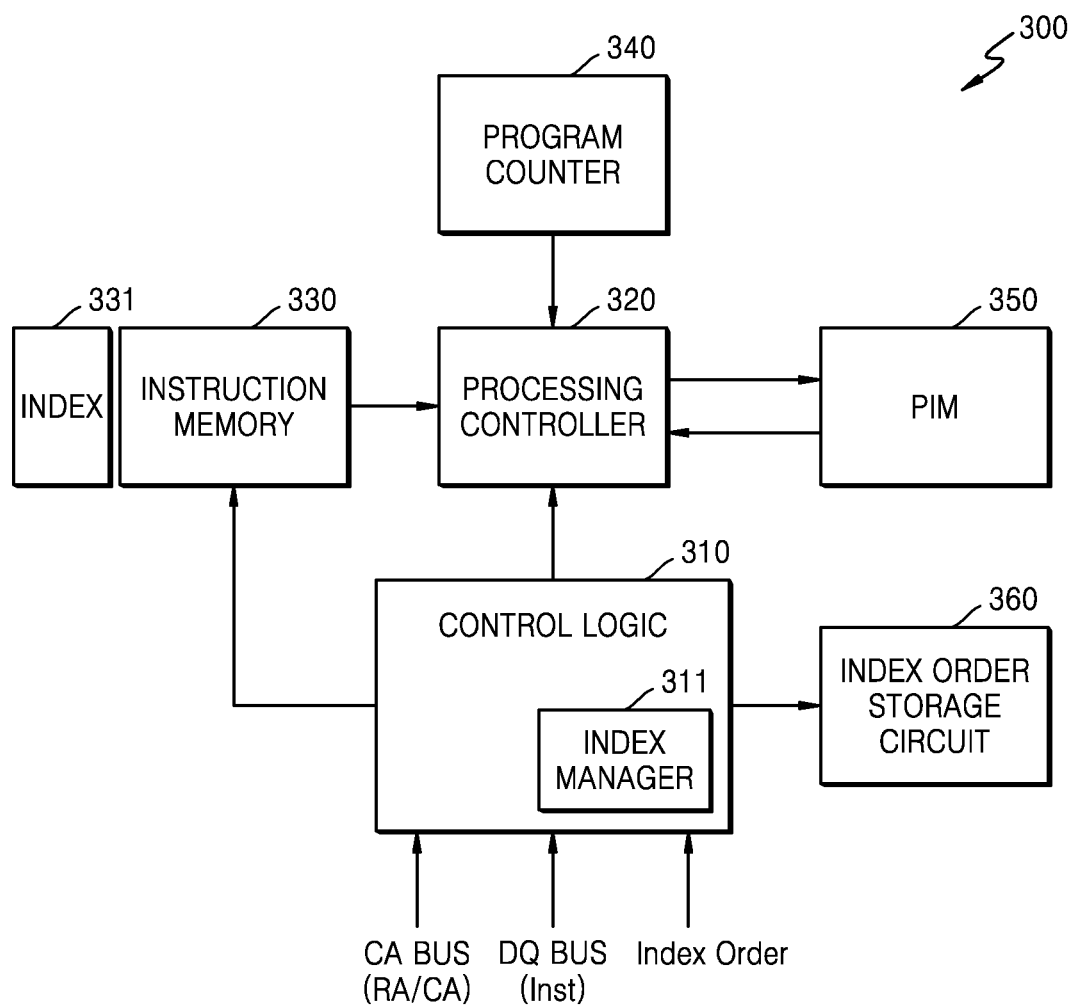
FIG. 9 is a schematic block diagram illustrating an implementation example of a memory device according to an exemplary embodiment of the inventive concept.

FIG. 9 illustrates an implementation example of a memory device 300 according to an exemplary embodiment of the inventive concept. In FIG. 9, an example is illustrated in which, in relation to instruction loading and executing operations, indices corresponding to instructions are generated and the instructions are executed based on the indices.

Referring to FIG. 9, the memory device 300 may include a control logic 310, a processing controller 320, an instruction memory 330, a program counter 340, a PIM circuit 350, and an index order storage circuit 360. For ease of description, although not specifically shown in FIG. 9, the memory device 300 may further include a memory bank having a plurality of bank arrays. In addition, in FIG. 9, only one PIM circuit 350 is illustrated. However, a plurality of PIM circuits may be provided in the memory device 300 to correspond to the plurality of bank arrays.

According to the above-described embodiments, the instruction memory 330 may include a plurality of instruction queue segments for storing instructions based on the circular queue technique. In addition, the instruction memory 330 may include a plurality of rows and a plurality of columns, and an instruction storage position may be directed by a queue address including a row address RA and a column address CA. For example, when it is assumed that each of the instruction queue segments of the instruction memory 330 stores one instruction, one row of the instruction memory 330 may include a plurality of instruction queue segments.

The memory device 300 may receive the command and address from the host HOST through the command address bus CA BUS and may receive the queue address in relation to the instruction loading or updating operation. In addition, the memory device 300 may receive the instructions Inst from the host HOST. For example, the memory device 300 may receive the instructions Inst through the data bus DQ BUS. In addition, in the instruction executing and updating mode, based on control of the processing controller 320, an instruction may be read from the instruction memory 330 and executed and, based on control of the control logic 310, the instructions Inst from the host HOST may be updated to the instruction memory 330.

The control logic 310 may include an index manager 311 and the index manager 311 may generate indices Index corresponding to the instructions Inst. According to exemplary embodiments, the indices Index may be assigned to entries of the instruction queue segments of the instruction memory 330, in which the instructions are stored, and an operation of directing executed instructions may be performed based on the indices Index. For example, the index manager 311 may calculate the indices Index corresponding to the instructions by using at least some of the bits included in the row address RA and the column address CA and, when the instructions are stored in the instruction memory 330, may store a corresponding indices Index together with the instructions. Alternatively, according to the embodiment illustrated in FIG. 9, an index memory 331 is further provided in the memory device 300 and the indices Index may be stored in the index memory 331.

The index order storage circuit 360 may store index order information provided by the host HOST. For example, after the plurality of instructions are loaded into the instruction memory 330 and the instruction loading operation is completed, in order to set the execution order of the instructions loaded on the instruction memory 330, the index order information may be provided from the host HOST to the memory device 300.

Then, the memory device 300 may read and execute the instructions in the index order stored in the index order storage circuit 360 in performing the operation logic processing operation. For example, whenever the operation logic processing operation is performed, an index Index stored in the index order storage circuit 360 is read and the control logic 310 may provide the read index Index to the processing controller 320. An indices Index corresponding to a plurality of instructions to be serially processed may be included in the index order information.

According to an exemplary embodiment, the indices Index may be set to have various values. For example, to correspond to m instructions stored in m instruction queue segments included in the instruction memory 330, the indices Index having one or more bits are generated and indices Index having different bit values may be stored in the instruction memory 331 to correspond to the instructions. The processing controller 320 may compare the index Index read from the index order storage circuit 360 with the indices Index stored with the instruction memory 330, may read an instruction corresponding to the received index Index, and may control the operation logic processing operation.

According to the above-described embodiment, a plurality of instructions for directing the same kind of operations need not be repeatedly stored in the instruction memory 330. For example, multiple indices may be used for a single stored instruction within the circular queue to execute that instruction repeatedly prior to overwriting. Therefore, a size of the instruction memory 330 may be reduced. In addition, without executing the instructions in the order stored in the instruction memory 330, based on the information stored in the index order storage circuit 360, an instruction stored in an arbitrary position may be executed as needed.

In the operation logic processing operation according to the above-described embodiment, an access operation of the instruction memory 330 based on a counting operation of the program counter 340 may be selectively performed. For example, some of the plurality of operations of the neural network function may be performed based on the counting operation of the program counter 340 and other operations may be performed based on the information stored in the index order storage circuit 360. Alternatively, according to some embodiments, when the instructions are executed based on the information stored in the index order storage circuit 360, the program counter 340 may be deactivated. Alternatively, the program counter 340 need not be provided in the memory device 300.

The instruction updating operation according to the above-described embodiments may be applied to the embodiment illustrated in FIG. 9. As an operation example, the instructions stored in the instruction memory 330 may be executed one or more times. After the instructions are completely executed by a prescribed number of times or indices, a new instruction may be updated to an instruction queue in which the completely executed instruction had been stored. For example, the instructions of the instruction queue segments included in the instruction memory 330 may be sequentially executed and some instructions may be executed a plurality of times in accordance with the index order information. In this case, according to the above-described embodiments, the instruction updating operation may be substantially sequentially performed on the plurality of instruction queue segments.

Figure 10:
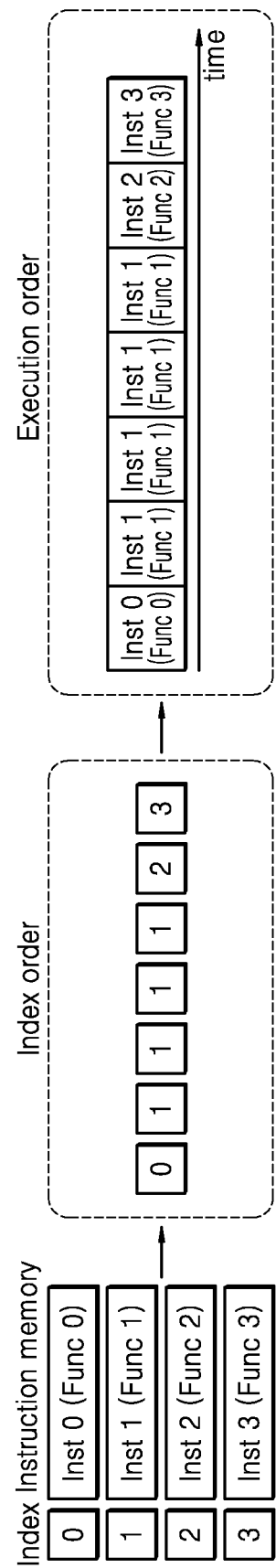
FIG. 10 is a partial schematic conceptual diagram illustrating an example in which instructions are executed based on an index order according to an exemplary embodiment of the inventive concept.

FIG. 10 illustrates an example in which instructions are executed based on an index order according to an exemplary embodiment of the inventive concept. In FIG. 10, for ease of description, the first to fourth instructions Inst 0 to Inst 3 stored in the first to fourth instruction queue segments are indicated by numbers 0-3, and an example in which the first to fourth indices 0 to 3 are allotted to correspond to the first to fourth instructions Inst 0 to Inst 3 is illustrated.

Referring to FIGS. 9 and 10, the first to fourth instructions Inst 0 to Inst 3 may be loaded on the instruction memory and the first to fourth indices 0 to 3 corresponding to the first to fourth instructions Inst 0 to Inst 3 may be stored in the instruction memory. In addition, the first to fourth instructions Inst 0 to Inst 3 may perform different functions. For example, first to fourth functions Func 0 to Func 3 performed by the first to fourth instructions Inst 0 to Inst 3 may correspond to different kinds of operations.

The memory controller or the host may provide the index order information related to instruction execution to the memory device, and the index order information may be stored in the index order storage circuit in the memory device. The index order information may represent the order of instructions to be executed for operation processing and, as the same index is repeatedly stored, the same instruction, such as, for example, an instruction stored in one instruction queue segment, may be repeatedly executed a plurality of times. In FIG. 10, an example in which the index order is set as "0, 1, 1, 1, 1, 2, 3" is illustrated.

The memory device may sequentially perform a plurality of operation logic processing operations in response to the command and/or address from the memory controller and may refer to an index stored in the index order storage circuit whenever an operation logic processing operation is performed. For example, the first instruction Inst 0 stored in a first instruction queue may be executed in accordance with the first index 0 and then, the second instruction Inst 1 stored in a second instruction queue may be repeatedly executed four times in accordance with the second index 1. Then, in accordance with the third index 2 and the fourth index 3, the third instruction Inst 2 stored in a third instruction queue and the fourth instruction Inst 3 stored in a fourth instruction queue may be sequentially executed.

According to the above-described embodiment, without repeatedly storing the same instruction for executing the same kind of operation in the plurality of instruction queue segments, an instruction stored in an instruction queue directed by an index previously stored in the memory device may be read and repeatedly executed. Therefore, the repeated operation may be performed with low memory usage.

FIG. 11 illustrates an instruction storage example and an index allocation example according to an exemplary embodiment of the inventive concept.

Referring to FIG. 11, the exemplary instruction memory may include a plurality of instruction queue segments, and the plurality of instruction queue segments may be addressed by the row address RA for m rows and the column address CA for four columns. For example, a plurality of instruction queue segments may be included in one row. In FIG. 11, an example in which, as four instructions are stored in one row, $4m$ instructions Inst 0 to Inst 4−1 are stored in the circular queue of the instruction memory including the m rows and four columns as illustrated. In alternate embodiments, the rows may each define one of a plurality of circular queues, the columns may each define one of a plurality of circular queues, or any combination thereof. For example, each circular queue may correspond to each PIM, or one to many or many to one.

According to the above-described embodiment, based on at least some of the bits included in the row address RA and the column address CA of the instruction memory, a physical position in which an instruction is stored may be determined. Therefore, based on at least some bits of the row address RA and the column address CA, indices corresponding to the instructions may be calculated. For example, an index having a first value 0 is calculated based on a queue address that represents a storage position of the first instruction Inst 0, an index having a second value 1 is calculated based on a queue address that represents a storage position of the second instruction Inst 1, and indices corresponding to the other instructions may be calculated. In alternate embodiments, the position may be virtual or re-mapped rather than physical.

Although not specifically shown in FIGS. 9 to 11, the host HOST may manage indices corresponding to instructions by the same method as that of the memory device based on a queue address to be provided to the memory device. In addition, the host HOST may determine the kinds or types of a plurality of operations serially performed in relation to the neural network function, may generate the index order information so that the instructions may be executed to correspond to the order of the plurality of operations, and may provide the generated index order information to the memory device.

Figure 12:
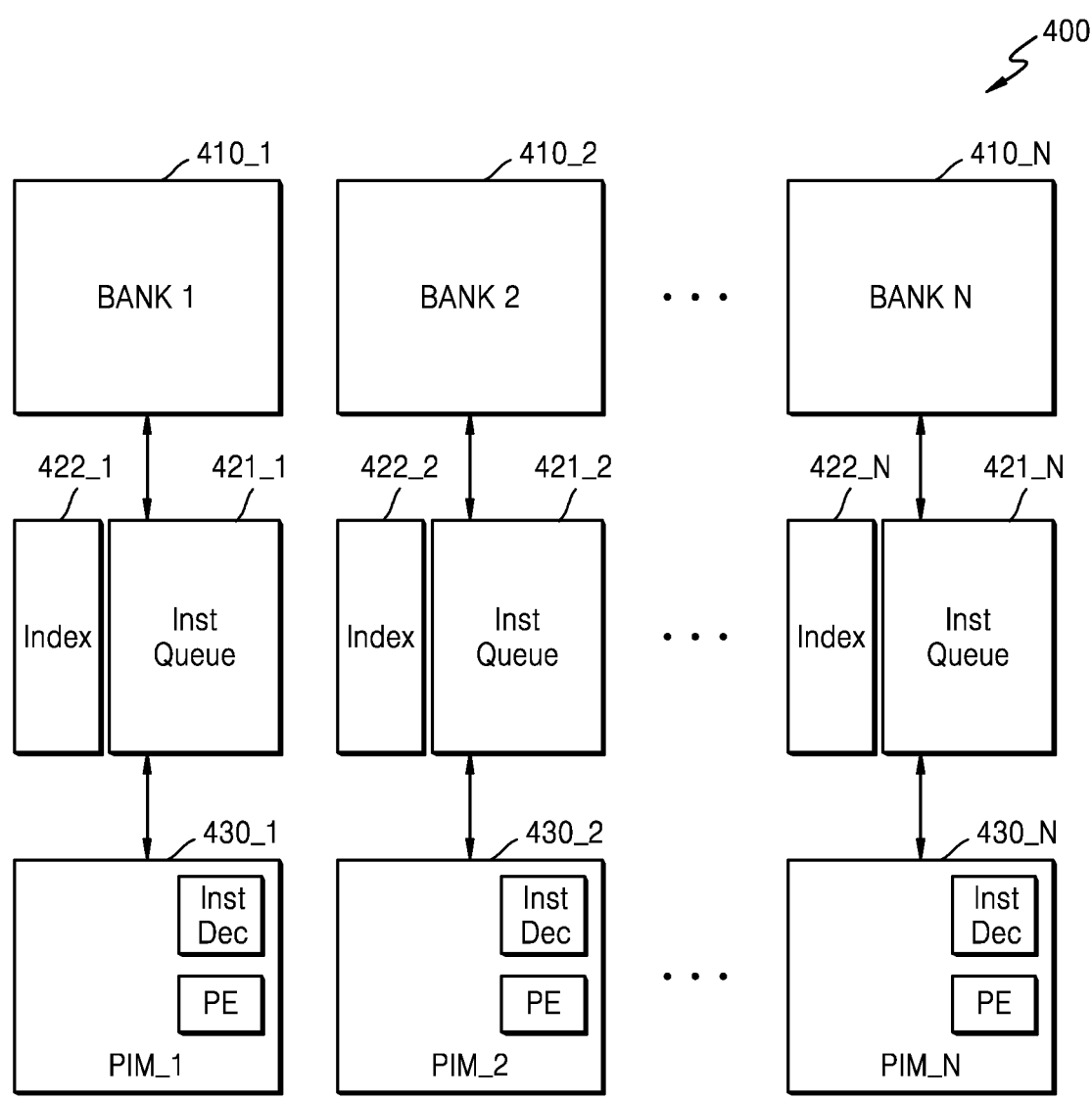
FIG. 12 is a schematic block diagram illustrating an implementation example of a memory device according to an exemplary embodiment of the inventive concept.

FIG. 12 illustrates an implementation example of a memory device 400 according to an exemplary embodiment of the inventive concept. In FIG. 12, an example is illustrated in which components related to operation processing are arranged to correspond to bank arrays.

Referring to FIG. 12, the memory device 400 may include first to Nth bank arrays 410_1 to 410_N and first to Nth PIM circuits 430_1 to 430_N arranged to correspond to the first to Nth bank arrays 410_1 to 410_N. Each of the first to Nth PIM circuits 430_1 to 430_N may perform an operation logic processing operation by using at least one of information read from a corresponding bank or data provided by the host HOST.

According to the above-described embodiments, duplicate description may be omitted. Here, the memory device 400 may include instruction memories for storing instructions related to operation processing and the instruction memories may be arranged to correspond to the first to Nth bank arrays 410_1 to 410_N. For example, first to Nth instruction memories 421_1 to 421_N may be provided in the memory device 400 and each of the first to Nth instruction memories 421_1 to 421_N may each include a circular queue having plurality of instruction queue segments for storing instructions by the circular queue technique. In addition, when the indices in the above-described embodiment are applied, indices corresponding to instructions stored in the first to Nth instruction memories 421_1 to 421_N may be further stored. In FIG. 12, first to Nth index memories 422_1 to 422_N arranged to correspond to the first to Nth bank arrays 410_1 to 410_N are illustrated. According to the current embodiment, the index memories and the instruction memories are illustrated as being separate from each other. However, indices may alternately be stored in corresponding circular instruction queues or their respective instruction queue segments.

In addition, according to the above-described embodiment, storage circuits for storing the index order information from the host HOST may be further provided in the memory device 400 and the storage circuits for storing the index order information may also be arranged to correspond to the bank arrays. According to an exemplary embodiment, index orders may be set to be the same or different from each other to correspond to the first to Nth bank arrays 410_1 to 410_N. Therefore, in the instruction memories arranged to correspond to different bank arrays, instructions stored in instruction queue segments in different positions may be executed.

Each of the first to Nth PIM circuits 430_1 to 430_N may include one or more processing elements PE for performing operation logic processing operations and the instructions read from the first to Nth instruction memories 421_1 to 421_N may be provided to corresponding PIM circuits. Each of the first to Nth PIM circuits 430_1 to 430_N may further include an instruction decoder for decoding an instruction and an operation logic processing operation of a kind in accordance with the instruction decoding result may be performed.

According to the embodiment illustrated in FIG. 12, since the instruction memories are arranged to correspond to the bank arrays and/or the PIM circuits, transmission paths of the instructions to the PIM circuits may be simplified and instruction reading speeds may be increased. In addition, since different instructions may be provided to the first to Nth PIM circuits 430_1 to 430_N, different kinds of operations may be processed in parallel. In addition, according to embodiments of the inventive concept, by providing the instruction memories using the circular queue technique, sizes of the instruction memories corresponding to the PIM circuits may be reduced. Therefore, even when each of the plurality of instruction memories is arranged to correspond to each of the plurality of bank arrays, respectively, increase in sizes of the plurality of instruction memories may be minimized.

Figure 13:
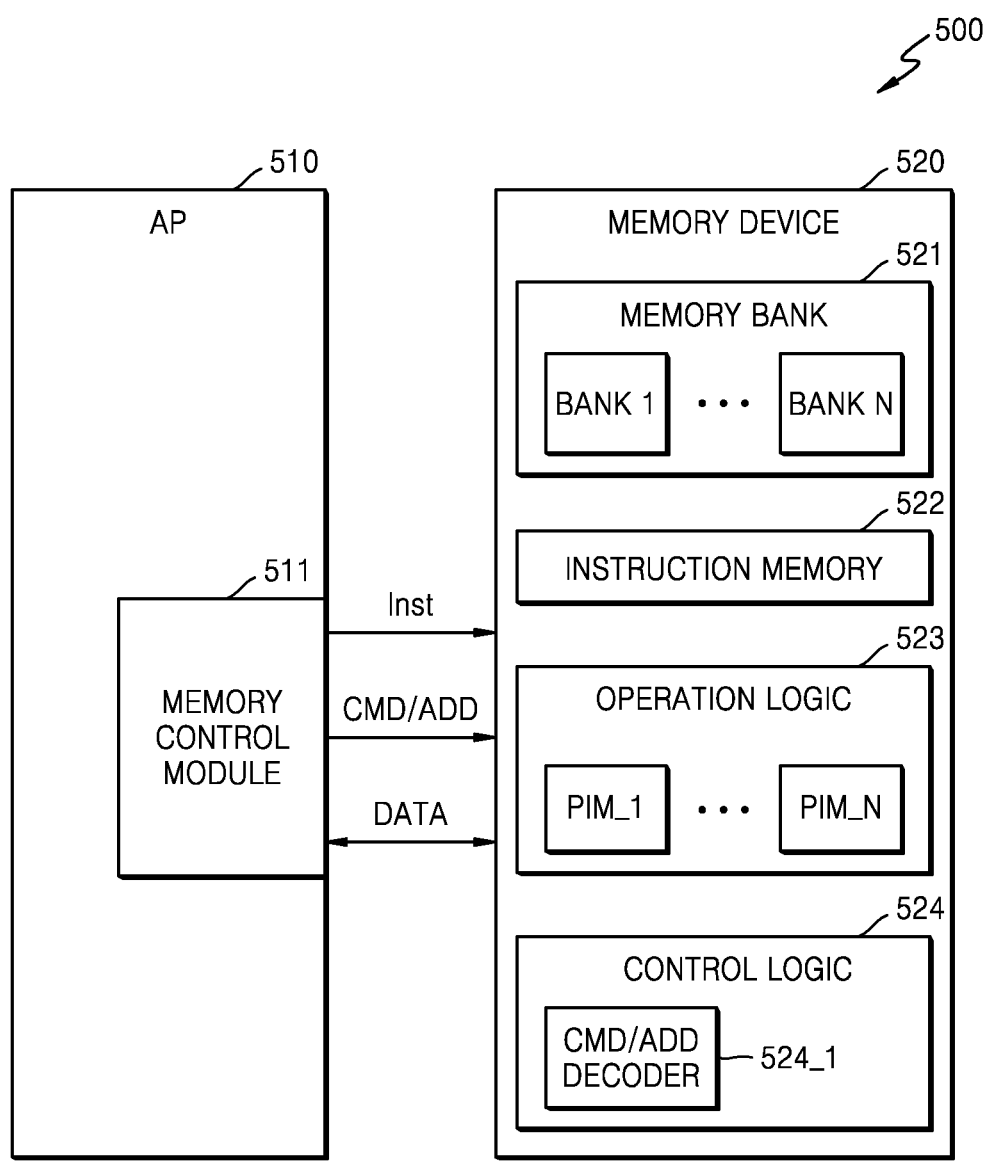
FIG. 13 is a schematic block diagram illustrating a data processing system including a memory device according to an exemplary embodiment of the inventive concept.

FIG. 13 illustrates a data processing system 500 including a memory device according to an exemplary embodiment of the inventive concept. As illustrated in FIG. 13, the data processing system 500 may include an application processor (AP) 510 and a memory device 520 and the application processor 510 may include a memory control module 511 for communicating with the memory device 520.

The application processor 510 may perform a function of the host HOST in FIG. 1. According to the above-described embodiments, in the instruction loading mode, the plurality of instructions Inst may be provided to the memory device 520 and the memory device 520 may be controlled so that the instruction updating operation is performed during a process of executing the instructions. In addition, according to the above-described embodiments, when the instructions are executed based on the indices, the application processor 510 may generate the index order information and may provide the generated index order information to the memory device 520.

The application processor 510 may be implemented by a system on chip (SoC) including a system bus. As a standard specification of the system bus, an advanced microcontroller bus architecture (AMBA) protocol of advanced RISC machine (ARM) may be applied. A bus type of the AMBA protocol may be an advanced high-performance bus (AHB), an advanced peripheral bus (APB), an advanced eXtensible interface (AXI), AXI4, or AXI coherency extensions (ACE). Other than the above protocol, another type of protocol such as uNetwork of SONICs Inc., CoreConnect of IBM, or an open core protocol of OCP-IP may be applied, or the like.

The memory control module 511 may perform a function of the memory controller in the above-described embodiments and may control a memory bank operation or the operation logic processing operation, in the memory device 520, by transmitting the command and/or address CMD/ADD to the memory device 520. According to the above-described embodiments, the memory device 520 may include a memory bank 521, an instruction memory 522, operation logic 523, and control logic 524, where the operation logic 523 may include one or more PIM circuits PIM_1 to PIM_N, and the control logic 524 may include a command and/or address decoder 524_1. In addition, the instruction memory 522 may include circular queue based instruction queue segments. According to the above-described embodiments, after a previously stored instruction is executed, an updating operation may be performed in which a new instruction is written over a previously executed instruction in an instruction queue based on control of the application processor 510.

Figure 14:
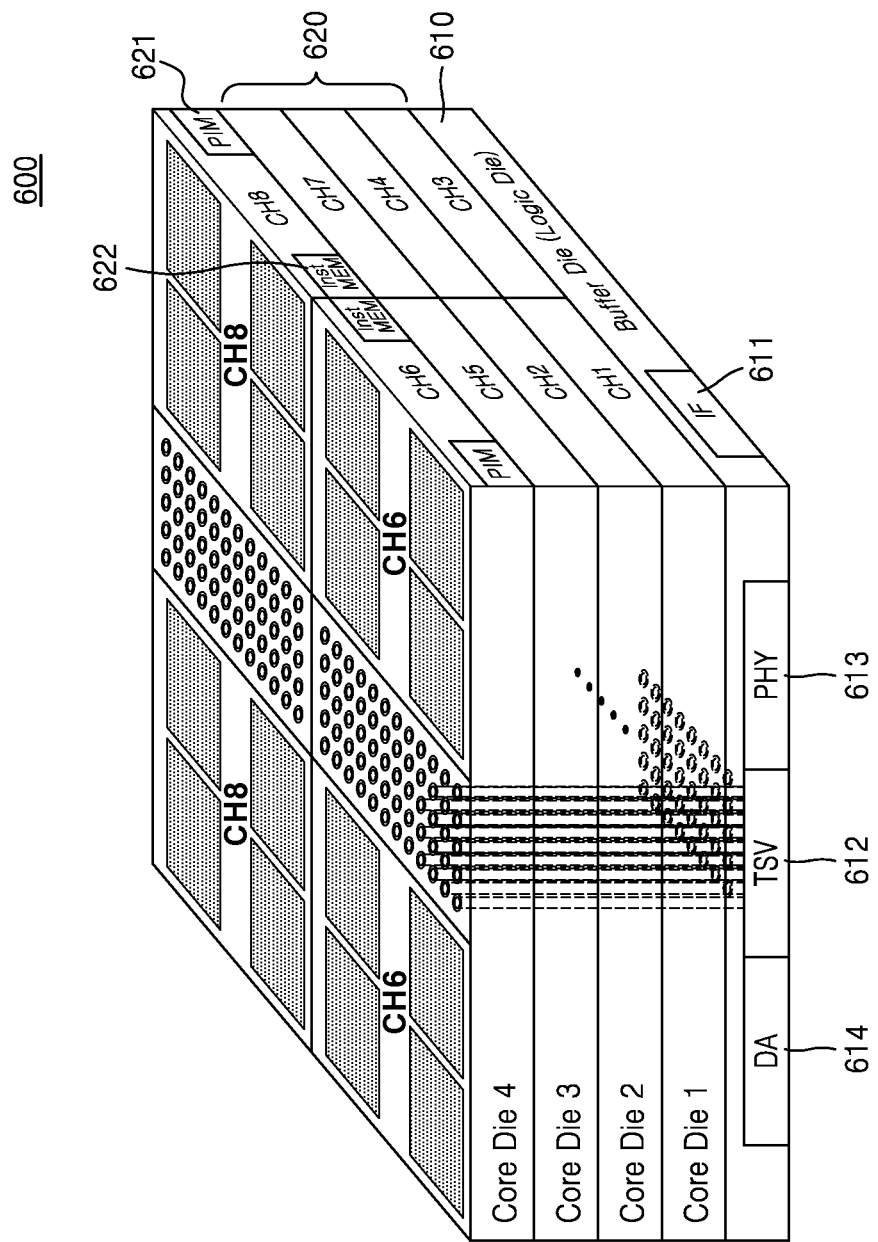
FIG. 14 is a partial schematic isometric diagram illustrating an example in which a memory device includes high bandwidth memory (HBM) according to an exemplary embodiment of the inventive concept.

FIG. 14 illustrates an example in which a memory device includes high bandwidth memory (HBM) 600 according to an exemplary embodiment of the inventive concept.

The HBM 600 may have an increased bandwidth by including a plurality of channels having independent interfaces. Referring to FIG. 14, the HBM 600 may include a plurality of dies, for example, a buffer die (or a logic die) 610 and one or more core dies 620 stacked on the buffer die 610. Referring to FIG. 14, an example in which first to fourth core dies are included in the HBM 600 is illustrated. However, the number of core dies 620 may vary.

In addition, each of the core dies 620 may include one or more channels. In FIG. 14, an example is illustrated in which each of the core dies 620 includes two channels so that the HBM 600 includes eight channels, CH1 to CH8, in total. For example, the first core die may include first and third channels CH1 and CH3, the second core die may include second and fourth channels CH2 and CH4, the third core die may include fifth and seventh channels CH5 and CH7, and the fourth core die may include sixth and eighth channels CH6 and CH8.

The buffer die 610 may include an interface circuit 611 for communicating with the host, or the memory controller, and may receive the command and/or address and data from the host HOST through the interface circuit 611. The host HOST may transmit the command and/or address and data through buses arranged to correspond to the channels. Buses may be divided by channel or some buses may be shared by two channels or the number of channels per die. The interface circuit 611 may transmit the command and/or address and data to a channel requested by the host HOST to perform the memory operation or the operation logic processing operation.

Each of the channels of the HBM 600 may include a PIM circuit 621 and an instruction memory 622 according to the above-described embodiments. Duplicate description is omitted. The instruction memory 622 may include a plurality of instruction queue segments for storing instructions based on the circular queue technique.

Although not specifically shown in FIG. 14, when the indices are applied, the channels of the HBM 600 may further store the indices corresponding to the instructions in the instruction memory 622 and may additionally store the index order information from the host HOST in the channels.

The buffer die 610 may further include a through-silicon-via (TSV) region 612, a physical (PHY) region 613, and a direct access (DA) region 614. Although not specifically shown in FIG. 14, a processor for controlling an overall operation of the HBM 600 such as control of a route of data may be further included in the buffer die 610.

In the TSV region 612, TSVs for communicating with the core dies 620 are formed. In addition, the physical PHY region 613 may include a plurality of input and output circuits for communicating with the external host HOST. For example, the physical PHY region 613 may include one or more ports for communicating with the host HOST.

The direct access region 614 may be arranged to directly communicate with an external tester through a conductive unit arranged on an external surface of the HBM 600 in a mode of testing the HBM 600.

Figure 15:
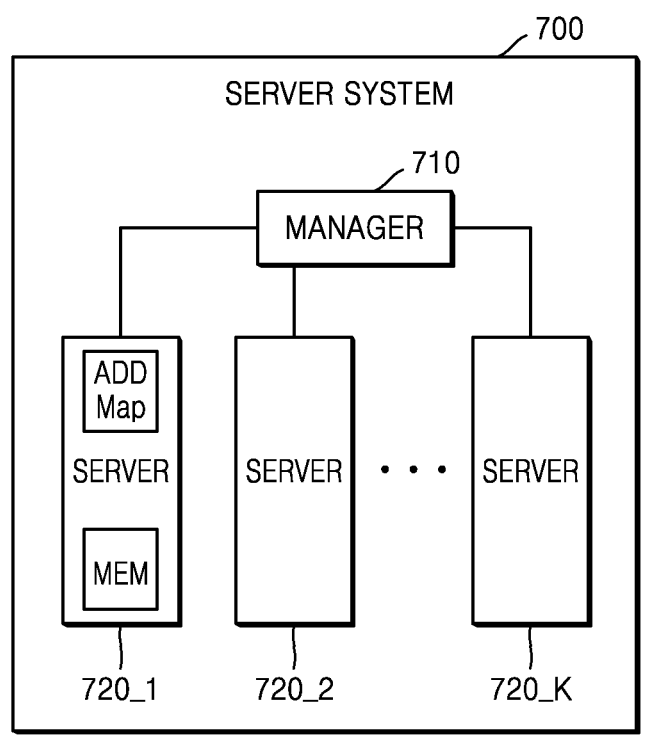
FIG. 15 is a schematic block diagram illustrating a server system according to an embodiment of the inventive concept.

FIG. 15 illustrates a server system 700 including a data processing system according to an embodiment of the inventive concept.

Referring to FIG. 15, the server system 700 may include a manager 710 and a plurality of servers 720_1 to 720_K. Each of the plurality of servers 720_1 to 720_K may correspond to the data processing system described in the above-described embodiments. The plurality of servers 720_1 to 720_K are connected to each other through a bus that supports a protocol, such as, for example, PCI or PCIe. For example, the plurality of servers 720_1 to 720_K may communicate with each other through a P2P connection structure based on control of the manager 710.

Referring to one server, such as, for example, the first server 720_1, the first server 720_1 may include the host HOST according to the above-described embodiments and one or more memory devices MEM, that may perform various kinds of operation logic processing operations in accordance with a function of the server and the above-described embodiments, wherein duplicate description is omitted, and may store the processing results. According to an embodiment, each of the memory devices MEM may include the memory device of the embodiments illustrated in FIGS. 1 to 14. Therefore, each of the memory devices MEM may include a circular queue based instruction memory.

While exemplary embodiments of the inventive concept have been particularly shown and described with reference to the several drawings, it will be understood that various changes in form and details may be made therein by those of ordinary skill in the pertinent art without departing from the scope or spirit of the present disclosure and the following claims.

What is claimed is:

1. A memory device comprising:
a memory bank including at least one bank array of memory cells;
a processor in memory (PIM) circuit connected to the memory bank and configured to perform an operation logic processing operation by using at least one of data received from a host or data read from the memory bank; and
an instruction memory connected to the PIM circuit and including a circular instruction memory queue having a plurality of first to $m^{th}$ instruction queue segments configured in a circle to store instructions received from the host, wherein instructions stored in the first to $m^{th}$ instruction queue segments are executed in response to an operation request from the host, and a new instruction received from the host is written over a completely executed instruction at a segment in the circular instruction memory queue, wherein, with respect to a plurality of commands received from the host related to one neural network function, the operation logic processing operation and an operation for writing the new instruction are performed together, based on a result of decoding some commands selected from the plurality of commands, wherein the operation logic processing operation is selectively performed, based on a result of decoding other commands selected from the plurality of commands, and wherein when the operation for writing the new instruction is performed in response to said some commands, an address indicating an instruction queue segment in which the new instruction is stored is received from the host.

2. The memory device of claim 1,
wherein some of a plurality of instructions are stored in the first to $m^{th}$ instruction queue segments in relation to one neural network function, and
wherein others of the plurality of instructions are sequentially written over completely executed instructions among the first to $m^{th}$ instruction queue segments.

3. The memory device of claim 1, further comprising,
a command and address decoder configured to decode a current command or current address received from the host, to control a memory bank operation on the memory bank based on the decoded current command or current address, or to perform a control operation controlling the PIM circuit to perform the operation logic processing operation.

4. The memory device of claim 1,
wherein the memory bank comprises a plurality of first to $N^{th}$ bank arrays and the PIM circuit comprises a same plurality of first to $N^{th}$ PIM circuits arranged to correspond to the first to $N^{th}$ bank arrays, and
wherein the instruction memory is arranged to correspond to each of the first to $N^{th}$ PIM circuits and an instruction read from the instruction memory is provided to a corresponding PIM circuit.

5. The memory device of claim 1,
wherein the memory device operates in a loading mode, an executing mode, and an executing and updating mode,
wherein, in the loading mode, first to $m^{th}$ instructions are stored in the first to $m^{th}$ instruction queue segments,
wherein, in the executing mode, in response to the operation request from the host, at least some of the first to $m^{th}$ instructions are sequentially executed, and
wherein, in the executing and updating mode, in response to the operation request from the host, while executing instructions stored in the instruction memory, a new instruction is written over a previously executed instruction in the circular instruction memory queue.

6. The memory device of claim 1,
wherein first to $m^{th}$ instructions are stored in the first to $m^{th}$ instruction queue segments, and
wherein, after the first instruction is executed, while a second instruction is executing, an $(m+1)^{th}$ instruction is written over the first instruction in the circular instruction memory queue.

7. The memory device of claim 1,
wherein first to $m^{th}$ instructions are stored in the first to $m^{th}$ instruction queue segments, and
wherein, after a plurality of first to $k^{th}$ instructions are sequentially executed, an operation of writing a new instruction starts from the first executed instruction in the circular instruction memory queue.

8. The memory device of claim 1, further comprising:
an index memory configured to store indices corresponding to instructions stored in the instruction memory; and
an index order storage circuit configured to store index order information representing an execution order of instructions received from the host,
wherein, as an operation request is received from the host, instructions stored in the instruction memory are executed in an order in accordance with the index order information.

9. The memory device of claim 8,
wherein, as a plurality of indices corresponding to the same instruction are included in the index order information, an instruction stored in one instruction queue segment is executed a plurality of times.

10. The memory device of claim 1,
wherein each of the first to $m^{th}$ instruction queue segments comprises at least one of a flip-flop or a latch.

11. The memory device of claim 1, further comprising:
an index order storage circuit configured to store index order information representing an execution order of a plurality of stored instructions,
wherein, as an operation request is received from the host, the plurality of stored instructions are executed in the execution order in accordance with the stored index order information.

12. The memory device of claim 11,
wherein, as a first plurality of indices corresponding to the same instruction are included in the index order information, an instruction stored in one instruction queue segment is executed a number of times equal to the first plurality of indices.

13. An operating method of a memory device having instruction memory configured to store a plurality of instructions related to operation processing and a processor in memory (PIM) circuit configured to perform operation logic processing operations corresponding to the instructions, the method comprising:
loading some of the plurality of instructions for a neural network function into a plurality of instruction queue segments of a circular instruction queue of the instruction memory;
the PIM circuit performing the operation logic processing operations by sequentially executing the loaded instructions;
overwriting, with others of the plurality of instructions for the neural network function, instruction queue segments having previously executed instructions; and
the PIM circuit performing the operation logic processing operations by sequentially executing the others of the plurality of instructions,
wherein, with respect to a plurality of commands received from a host related to one neural network function, one of the operation logic processing operations and an operation for writing a new instruction are performed together, based on a result of decoding some commands selected from the plurality of commands,
wherein the one of the operation logic processing operations is selectively performed, based on a result of decoding other commands selected from the plurality of commands, and
wherein when the operation for writing the new instruction is performed in response to said some commands, an address indicating an instruction queue segment in which the new instruction is stored is received from the host.

14. The method of claim 13,
wherein the memory device operates in a loading mode, an executing mode, and an executing and updating mode,
wherein, in the loading mode, the some of the plurality of instructions are stored in the instruction memory,
wherein, in the executing mode, in response to an operation request from the host, instructions stored in the instruction memory are sequentially executed, and
wherein, in the executing and updating mode, in response to an operation request from the host, while executing instructions stored in the instruction memory, a new instruction is written over a previously executed instruction in an instruction queue segment.

15. The method of claim 13,
wherein the instruction memory comprises a plurality of first to $m^{th}$ instruction queue segments, and a same plurality of first to $m^{th}$ instructions are stored in the first to $m^{th}$ instruction queue segments, and
wherein, after the first instruction is executed, while a second instruction is executing, an $(m+1)^{th}$ instruction is written over the first instruction in the circular instruction queue.

16. The method of claim 13,
wherein the instruction memory comprises a plurality of first to $m^{th}$ instruction queue segments, and a same plurality of first to $m^{th}$ instructions are stored in the first to $m^{th}$ instruction queue segments, and
wherein, after a plurality of first to $k^{th}$ instructions are sequentially executed, where k is less than m, an operation of writing a new instruction starts from the first instruction queue segment.

17. The method of claim 13,
wherein an operation of performing operation processing by executing one or more instructions, and an operation of writing one or more new instructions to one or more instruction queue segments containing one or more previously executed instructions, are alternately performed.

18. The method of claim 13, further comprising:
storing indices corresponding to the plurality of instructions; and
receiving index order information representing an execution order of the plurality of instructions from the host,
wherein, as an operation request is received from the host, the plurality of instructions stored in the instruction memory are executed in an order in accordance with the received index order information.

19. A memory device comprising:
a memory band including at least one bank array of memory cells;
a processor in memory (PIM) circuit connected to the memory bank and configured to perform an operation logic processing operation by using at least one of data received from a host or data read from the memory bank;
an instruction memory connected to the PIM circuit and including a circular instruction memory queue having a plurality of first to m$^{th}$ instruction queue segments configured in a circle to store instructions received from the host;

an index order storage circuit configured to store index order information representing an execution order of a plurality of stored instructions, wherein, as an operation request is received from the host, the plurality of stored instructions are executed in the execution order in accordance with the stored index order information; and a control logic circuit including a command/address decoder and an index manager circuit, the index manage circuit configured to receive from the command/address decoder bits of each address indicating each instruction queue segment in which each of the plurality of store instructions is stored, and to generate indices corresponding to the plurality of stored instructions using the received bits, wherein instructions stored in the first to m$^{th}$ instruction queue segments are executed in response to an operation request from the host, and a new instruction received from the host is written over a completely executed instruction at a segment in the circular instruction memory queue, wherein, with respect to a plurality of commands received from the host related to one neural network function, the operation logic processing operation and an operation for writing the new instruction are performed together, based on a result of decoding some commands selected from the plurality of commands, wherein the operation logic processing operation is selectively performed, based on a result of decoding other commands selected from the plurality of commands, and wherein when the operation for writing the new instruction is performed in response to said some commands, an address indicating an instruction queue segment in which the new instruction is stored is received from the host.

20. The memory device of claim 19,
wherein the control logic circuit receives a row address and a column address representing a storage position of the instruction memory, and generates a corresponding index by using at least some of a plurality of bits of the row address and the column address.

21. The memory device of claim 19, further comprising:
an index memory configured to store a plurality of indices corresponding to the plurality of stored instructions,
wherein the control logic circuit stores the plurality of indices in the index memory.

* * * * *